United States Patent [19]
Williams

[11] 3,964,251
[45] June 22, 1976

[54] WATCH SYSTEM HAVING ASYNCHRONOUS COUNTERS IMPLEMENTED BY D AND INVERTED D FLIP-FLOPS

[75] Inventor: Clark R. Williams, Plano, Tex.
[73] Assignee: Texas Instruments Incorporated, Dallas, Tex.
[22] Filed: Feb. 19, 1974
[21] Appl. No.: 443,894

[52] U.S. Cl. .............................. 58/23 R; 58/50 R; 328/48
[51] Int. Cl.² .................. G04C 3/00; G04B 19/30
[58] Field of Search .................. 58/23 R, 23, 85.5; 307/298–302; 328/43, 48

[56] References Cited
UNITED STATES PATENTS

| 3,673,501 | 6/1972 | Zeph | 328/43 |
| 3,699,763 | 10/1972 | Zeph | 58/23 R |
| 3,813,533 | 5/1974 | Cone et al. | 58/50 R |
| 3,899,691 | 8/1975 | Hama | 328/43 |

*Primary Examiner*—Edith Simmons Jackmon
*Attorney, Agent, or Firm*—Harold Levine; Edward J. Connors, Jr.; Stephen S. Sadacca

[57] ABSTRACT

An electronic timekeeping system is implemented in bipolar integrated circuit technology for displaying time by way of a digital display. The bipolar circuitry is implemented utilizing integrated injection logic with asynchronous counters having outputs synchronized with the clock before coupling to the succeeding counter function, such as between the seconds and minutes counters. "D" flip-flops are utilized such that a $\overline{D}$ input is provided instead of a D input.

13 Claims, 50 Drawing Figures

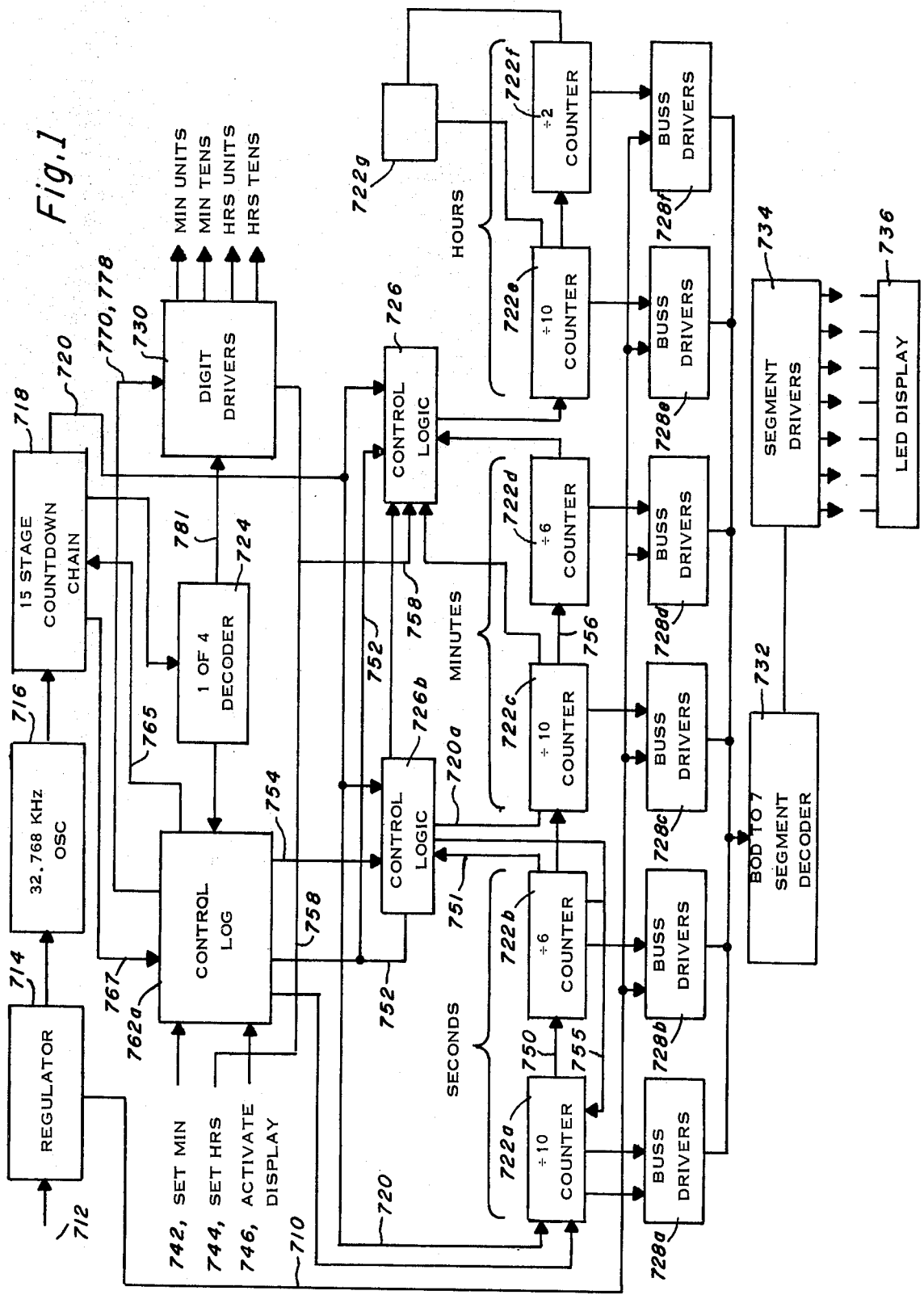

Fig. 3l

| Fig. 3f | Fig. 3i |
|---|---|

| Fig. 3c | Fig. 3e | Fig. 3h | Fig. 3k |
|---|---|---|---|
| Fig. 3b | Fig. 3d | Fig. 3g | Fig. 3j |

Fig. 3a

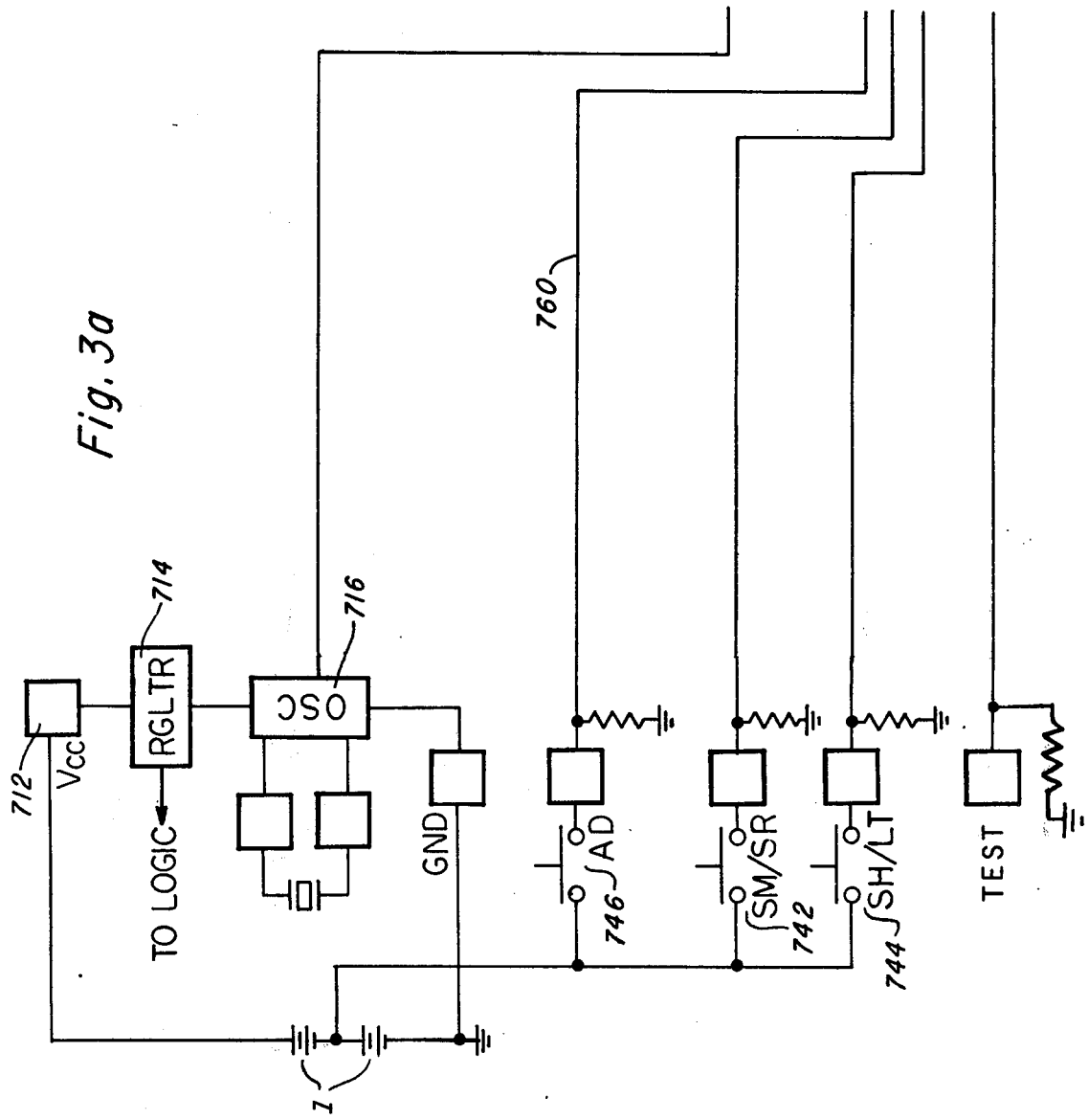

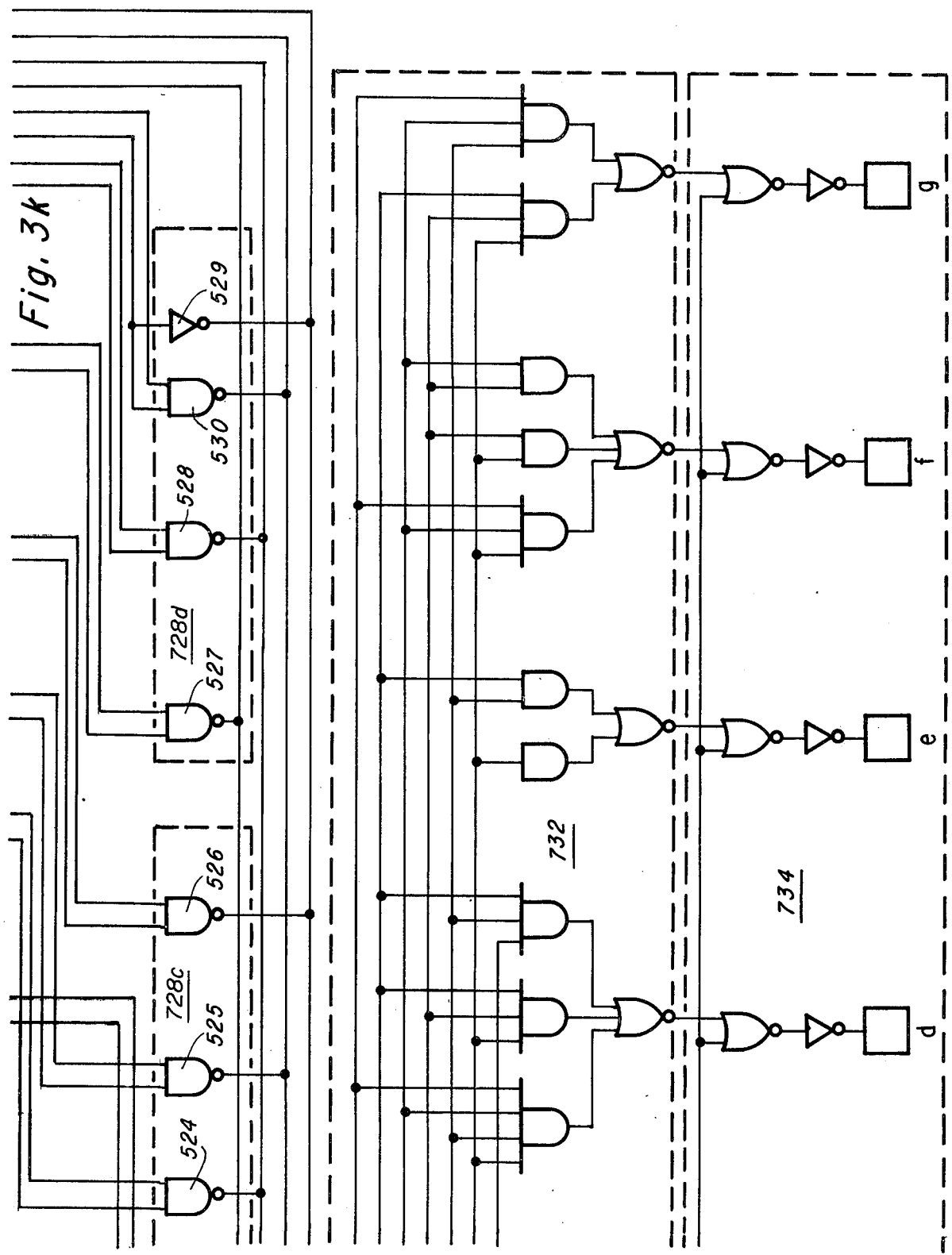

| Fig. 4a | Fig. 4b | Fig. 4c |     |
|---------|---------|---------|-----|
| Fig. 4d | Fig. 4e | Fig. 4f | Fig. 4g |
| Fig. 4h | Fig. 4i | Fig. 4j |     |
|         | Fig. 4k |         |     |

Fig. 4L

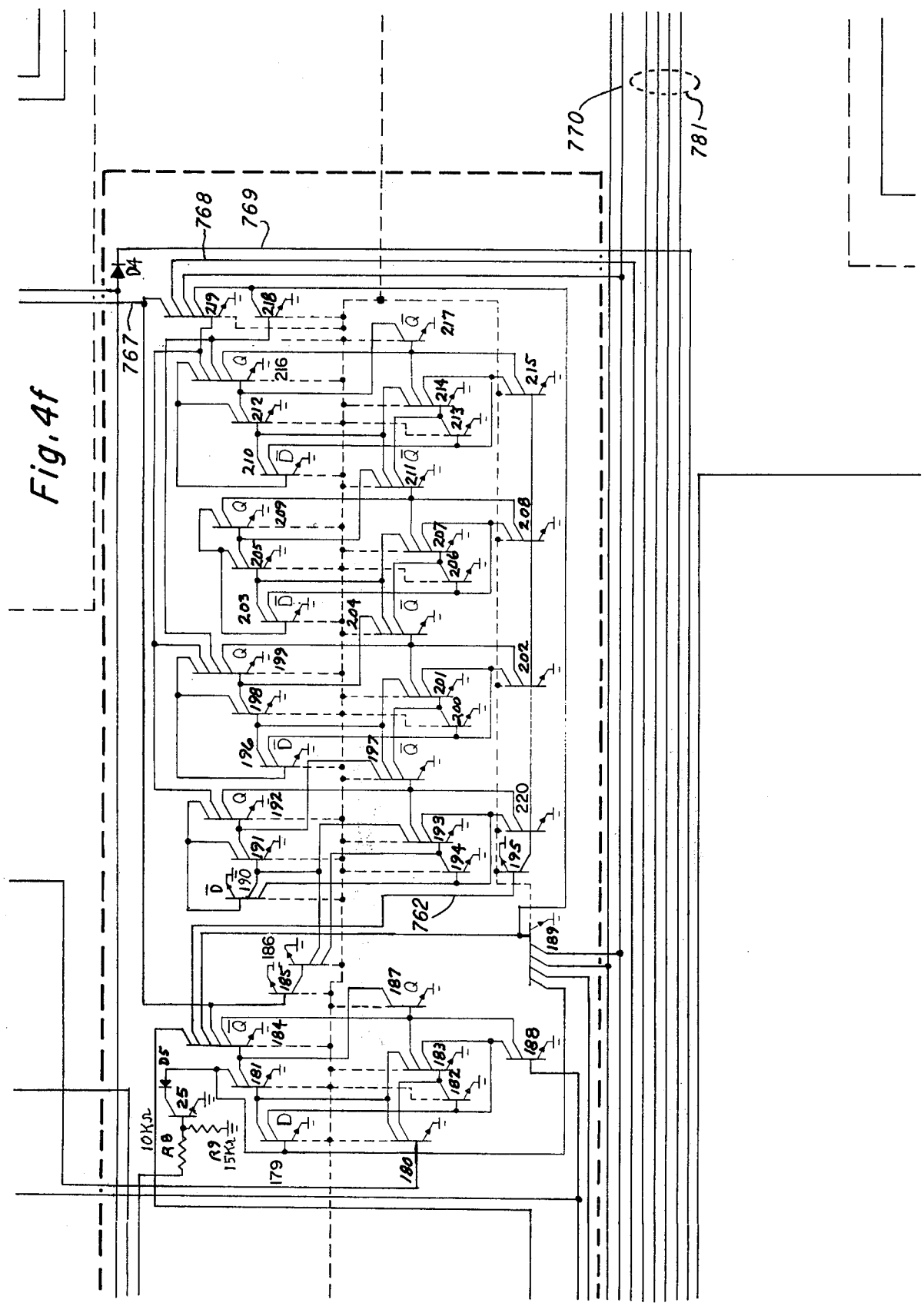

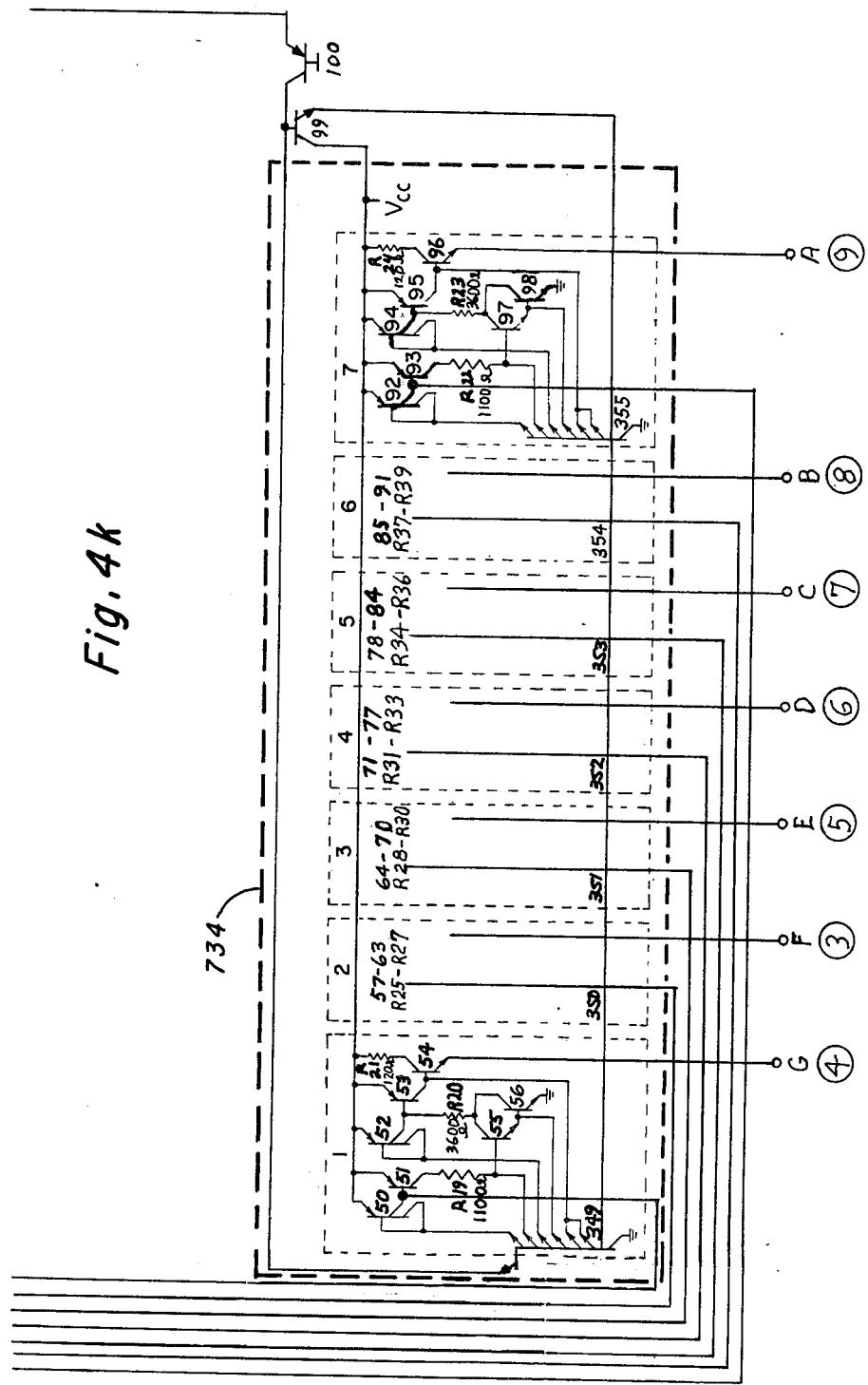

WATCH SYSTEM HAVING ASYNCHRONOUS COUNTERS IMPLEMENTED BY D AND INVERTED D FLIP-FLOPS

The present invention relates to electronic timekeeping devices in general and more particularly to the bipolar integrated injection logic implementation thereof.

Digital electronic timekeeping devices of sufficiently low power dissipation so as to allow application in a wristwatch have been described extensively in the literature. Complementary metal oxide semiconductor circuitry has been proposed utilizing asynchronous counters driving other asynchronous counters and is commercially available in the market place for actuating both VLED and liquid crystal type digital displays. Furthermore, bipolar electronic circuitry of the low power dissipation type and having synchronous counters and been proposed such as in copending patent application, "Electronic Timekeeping System", Ser. No. 264,212, filed June 19, 1972, by Williams et al.

Problems inherent in providing a digital wristwatch have been defined and are well known. For example, the watch circuitry must be configured so as to minimize power drain so as to maximize life of the watch battery. Furthermore, a technology must be utilized which lends itself readily to integrated circuit application, thereby requiring parameters and limitations suitable to the integration process. For example, process parameters must be well controlled and reproducible, and device geometries must be such so as to maximize device density in the integrated circuit chip. Still further, if a relatively new technology is utilized in the integrated circuit process, conventional logic and functional circuits must be redesigned to implement the functions most efficiently.

Low power, high circuit density bipolar integrated circuit concepts have been proposed utilizing the recently disclosed integrated injection logic ($I^2L$). See, for example, U.S. Pat. No. 3,736,477 which defines in detail the semiconductor structure of integrated injection logic wherein a lateral PNP transistor is utilized as an injector to an inversely operated NPN vertical transistor. Discussion thereof is further found in Integrated Injection Logic, *Microelectronics and Reliability*, Pergamon Press, 1972, (Great Britain), Volume 11, page 94, and in Integrated Logic Circuits, *IEEE International Solid State Circuits Conference*, 1972, pages 90–93. Application of such integrated injection logic circuitry into an electronic digital wristwatch has also been suggested utilizing logic directly coupled in electronic stacks.

Accordingly, an object of the present invention is to provide an electronic digital watch in integrated injection logic whereby circuit components are electrically stacked in series with the stacks intercoupled by diodes. Another object of the invention is to provide such an integrated injection logic watch with a countdown chain having graded power due to varying transistor geometries such as varying injection geometries. Yet another object of the invention is the provision of an electrically stacked oscillator/regulator series combination in such an $I^2L$ watch to reduce system power consumption. Still another object of the present invention is the utilization of asynchronous counters synchronized with the system clock signal between functions, preferably utilizing D flip-flops implemented in integrated injection logic and having respective Q outputs fed back to the $\overline{D}$ inputs for minimizing component requirements.

Briefly, and in accordance with the present invention, a bipolar electronic watch is implemented in integrated injection logic such that the countdown chain and counters are partitioned into a plurality of levels which are serially connected between first and second reference potentials, with the logic levels interconnected through a series diode. Current passes through one level for actuating the parallel connected elements therein, and is then collected and coupled to the succeeding level and so forth. The various levels have differing number of gates connected in parallel in each, and geometry of the emitter injector elements vary for grading the power distribution. Asynchronous counters are synchronized with the system clock so that the system clock is selectively input into the succeeding counter instead of the previous counter output for minimizing gate logic requirements. A current regulator is connected in series with an oscillator and is configured so as to provide a highly regulated timekeeping signal with a minimum of system power consumption. D flip-flops comprising the countdown chain are implemented such that the Q output thereof is fed back to a $\overline{D}$ input for minimizing component requirement. The injector in the integrated injection logic gates has a geometry varying so as to regulate and control power supplied to the respective gate.

The invention described and claimed herein also relates to copending applications Ser. Nos. 443,535; 443,585; and 443,895, all filed of even date with the present application and assigned to Texas Instruments Incorporated, the assignee of the present invention.

Other objects and advantages of the invention will be apparent upon reading the following detailed description of illustrative embodiments in conjunction with the drawings, wherein:

FIG. 1 is a functional block diagram of an electronic digital wristwatch;

FIGS. 3a–3l depict a detailed functional diagram of the electronic watch depicted in FIG. 1;

FIGS. 4a–4l illustrate specific circuitry for implementing the detailed functional block diagram of FIG. 3 in $I^2L$ logic;

Figure 2A:
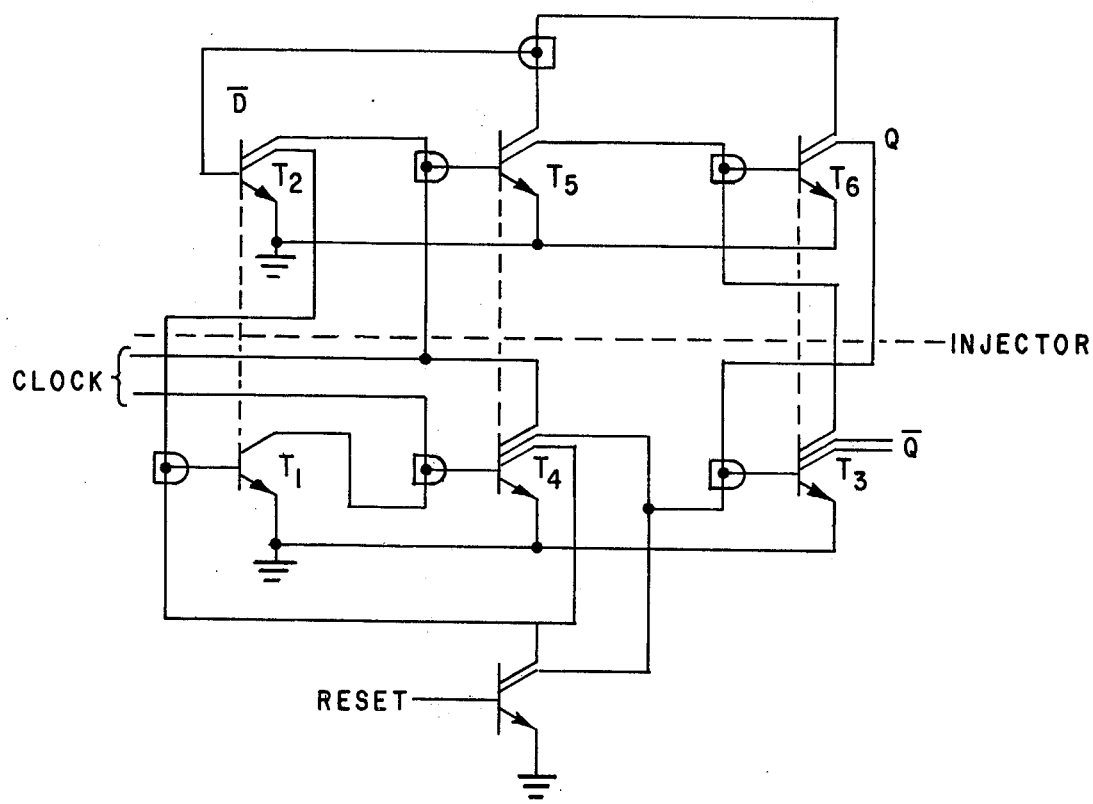
FIGS. 2a–2c depict the D flip-flop implemented in $I^2L$ logic according to the invention.

With reference now to the drawings, a functional description of a general watch system, a specific logic implementation thereof featuring asynchronous synchronized counters and then a specific $I^2L$ circuit implementation thereof will be set forth. The following description is best understood by considering FIGS. 1, 3a–l and 4a–l in combination, realizing that FIGS. 3a–3l is a detailed embodiment of FIG. 1, and FIGS. 4a–4l is a detailed version of FIGS. 3i–3l. Thereafter, specific circuits utilized in the $I^2L$ circuit of FIGS. 4a–l and specific integrated circuit improvements thereof will be described.

With reference to FIGS. 1, 3a–3l, and 4a–4l, the electronic elements of a digital wristwatch in accordance with the present invention is set forth. Batteries 701 generate a nominal 3 volt $V_{CC}$ input 712 to a regulator 714. A crystal controlled oscillator circuit 716 generates a 32.768 K Hertz timing signal to a fifteen stage countdown chain 718.

The 32.768 K Hertz master clock signal is coupled to the countdown chain 718 via inverter 114. Inverter 114 is a multi-collector I²L transistor pair and operates in a now well understood manner. For example, output transistor 18 in the oscillator 716 functions to render inverter transistor 114 nonconductive when driver semiconductor 18 is rendered conductive. As will be explained in more detail with respect to the circuit of FIGS. 2a–c, the gate input to the I²L transistor pair is used to functionally "turn off" the gate by removing the injection drive.

Countdown chain 718 comprises a fifteen stage ripple counter having six successive toggle flip-flops, a two stage Johnson counter, and seven additional successive toggle flip-flops. The output of the last flip-flop in the chain 718 generates the basic 1 Hertz timekeeping signal, which is communicated via line 720 to the counters. The last three stages of chain 718 are resettable for allowing accuracy of ⅛ second when time setting the watch. By gating via element 304 the 1 Hertz output signal with the 1, 2, 4, 8 and 16 Hertz countdown signals, a pulse width is generated of approximately .03 seconds, representing a 1/32 duty cycle. As this signal is utilized as an input to the various counters, in part responsive to the setting switches 742 and 744, the possibility of error due to inherent bouncing of switches 742 and 744 is minimized, as occurrence of the .03 pulse and actuation of the setting switch must be coincident. The countdown chain is generally comprised of a plurality of series connected D flip-flops implemented in I²L logic. The specific D flip-flop configuration herein utilized is a feature of this invention and is explained in detail with respect to FIGS. 2a–c.

The 1 Hertz system clock is coupled to asynchronous counters 722a–722f which respectively generate the seconds (tens and units digit), minutes (tens and units digit), and hours (tens and units digit) function. Tens digit counter 722a is a divide by ten asynchronous counter which provides a binary coded decimal output at each of four stages to effect the units digit of the seconds display. Tens digit counter 722b is a divide by six asynchronous counter which is responsive via line 750 to the counter 722a output which generates a binary coded decimal output indicative of the tens digit of seconds. The overall combination of counters 722a and 722b comprise an asynchronous divide by sixty counter for effecting tens and units digits of seconds display.

The output of the seconds counter 722b is coupled to control circuit 726b via line 751. Control circuit 726b is responsive to control circuit 726a via line 752 and to the 1 Hertz clock via line 720 for either coupling via line 720a one pulse of the 1 Hertz clock under control of the seconds counter 722b into counter 722c or coupling a series of 1 Hertz signals into counter 722c for rapid setting of the minutes. By logically coupling the output of the asynchronous counter to control circuitry for selectively coupling the system clock into the succeeding counter, less logic is required than otherwise if the asynchronous output and the clock are selectively input. Control circuit 726b is also responsive via line 754 to control circuit 726a for resetting via line 755 the seconds counters 722a and 722b to zero during "setting" of the watch.

The input to the tens digit minutes counters 722c via line 720a is either at the one per minute rate or one per second rate as controlled by control circuit 726a as above explained. Counter 722c is an asynchronous divide by ten counter for generating binary coded decimal outputs indicative of the ones digit of minutes. Counter 722d is an asynchronous divide by six counter for generating in response to counter 722c binary coded decimal outputs indicative of the tens digit of the minutes. The $\overline{Q}$ output from one collector of transistor 425 of the minutes counter 722c is coupled via line 757 back into the counter 722c for effecting a ring counter and is "wired anded" for resetting. The other collector output is input into counter 722d via line 756.

Output from counter 722d, 722c and from the control logic 726b and 726a is fed into control logic 726c for controlling input into the hours counters. Control 726c logically comprises a NAND gate 437 responsive to a BCD 5 and BCD 9 code from counters 722c and 722d and to line 752 from the control circuit 726a for enabling an output from gate 437 upon the five-nine condition. The output of gate 437 is logically NANDED with the output from the set hours switch 744 via line 758. Whenever the set hours switch is set via line 758, or the five-nine condition on the input to gate 437 is met, NAND gate 436 is enabled allowing the 1 Hertz signal via line 720 to be input into the hours counter 722e. Depending upon whether or not the set hours line is enabled, or the output from gate 437 is enabled, then either a single 1 Hertz pulse is input into the hours, or a series of 1 Hertz pulses is input for setting the hours counter. During the period when the hours counter is not to be incremented, transistor 436 is in a normally conductive condition thereby clamping the 1 Hertz signal on line 720b to a logic zero.

The units digit of the hours counter 722e is responsive to line 720b for either incrementing by one each sixty minute cycle or by incrementing by one at the 1 Hertz rate. Counter 722e is an asynchronous divide by ten counter while stage 722f in combination therewith provides capability of dividing by 20 for effecting tens digit read out. Feedback means 722g, however, causes the counters 722e and 722f to be recycled every twelve states (from one to thirteen) to provide the desired hour BCD output.

Referring now to control logic 726a, actuation of the activate display switch 746 on line 760 which is inverted on line 761 causes the $\overline{Q}$ output of D flip-flop 35 to go to a logic one which is communicated to NAND gate 189 causing a logic zero on the output thereof. Line 723 communicates this condition back to the D input of flip-flop 35 causing the D input to latch at a logic low level for approximately one 1-½ seconds regardless of the condition of the activate display switch. This output is communicated by line 774 to digit enable logic gate 141 which enables gates 145–148 for enabling the respective digit drivers 730. Thus, immediately upon actuation of the activate display switch, the minutes and hours digits of the displays are activated.

The high $\overline{Q}$ output of flip-flop 35 is then ANDED with the 8 Hertz signal via line 767 from the countdown chain with the normally high output from NAND gate 219 on line 768 to allow the 8 Hertz signal to ripple through stages 36–39. Between 1-⅛ and 1-½ seconds later, NAND gate 218 receives logic one inputs from flip-flops 37 and 39 to generate on line 769 a logic zero signal to NAND gate 189 for disabling the minutes and hours display. Substantially, simultaneously therewith, NAND gate 219 receives an all logic one input and generates on line 768 a logic zero which re-enables the minutes drivers from logic 730 by way of line 770 and disables the input to flip-flop 36. If the activate display switch has been held down during this interval such that a logic zero is still applied via line 761 to flip-flop 35, then the reset terminals to flip-flops 36-39 remain impressed with a logic zero voltage and NAND gate 219 is allowed to activate NAND gates 143 and 144 for enabling output from the seconds counter 722 to be displayed. Gates 143-148 are serially coupled by diodes to the output of the respective counters for disabling except when display is desired. In the circuit schematic of FIGS. 4a-4l, the various logic levels may be identified by referring to the emitters of the I²L transistors. A first level logic emitter is shown having a single ground bar indication to indicate a reference potential, the second logic level is shown having a double bar reference potential indication on the emitter. The third logic level is seen having three bar indicators on the emitter.

Referring to FIGS. 4a-4l, it is seen that the collector of gates 143-148 have their emitters tied to the second logic level in integrated injection logic whereas the anode of the respective diodes D13-D18 are coupled to the base of gates having their emitters respectively coupled to the third level of integrated injection logic. Inclusion of diodes D13-D18 serially between electronic logic levels in this system is a feature hereof. That is, by utilizing the approximately 0.7 volt drop when gates 143-148 are driven conductive, then less voltage swing thereon is encountered. Such improves switching time and therefore performance.

Upon release of the activate display switch 746 during display of the seconds, the $\overline{Q}$ output of flip-flop 35 returns to a logic zero level on line 762 causing logic one inputs to the reset terminals of flip-flops 36-39 causing gates 218 and 219 to return to a logic one state. When gate 219 returns to a logic one state, line 770 returns to a logic one and the minutes (seconds) drivers are disabled. Likewise, gates 143 and 144 decouple the output from the seconds register from the decoder 732.

Upon the activate display input to flip-flop 35, a logic one from the $\overline{Q}$ output is supplied via line 763 to the set terminal of flip-flop 42 which causes the Q output thereof to go to a logic one. Line 765 couples this logic one to gate 287 which resets the last three stages of the countdown chain 718. Such enables a more accurate setting of the time, up to approximately ⅛ of a second accuracy. Furthermore, the Q output of flip-flop 42 is coupled via line 754 to NAND gate 408 which resets the seconds counter via line 755.

Upon actuation of the set minutes switch 742, a logic zero is generated on line 777 to the D input of flip-flop 40 and to the wired AND gates which are input to NOT gates 159, 160. A logic one is impressed on the inverted D input to flip-flop 41 causing a low to be generated on the $\overline{Q}$ output thereof which is inverted on lines 752 and 778. Line 752 actuates the control 726b for enabling setting of the minutes register 722c at a rapid 1 Hertz rate due to line 720a.

Line 778 from the $\overline{Q}$ output of flip-flop 41 is coupled to logic gate 141 for enabling the output from the minutes and hours counters to be input to the segment decoder 732 and is further communicated to the digit drivers 730 for actuating the minutes and hours drivers.

Upon actuation of the set minutes switch 742, the $\overline{Q}$ outputs of flip-flops 40 and 41 go high which sets the Q output of flip-flop 42 by means of line 764. Upon the actuation of the set minutes switch 742, the $\overline{Q}$ output of flip-flop 40 goes low, removing the set from flip-flop 42 allowing the Q output to go to a logic zero on the next clock pulse thereafter. A zero on Q output line 765 sets NAND gate 287 which stops the watch by resetting the last three digits to zero of the countdown chain and resets the seconds counter to zero.

Actuation of the set hours switch 744 via line 779 directly enables the logic gate 141 for coupling the hours counter to the bus drivers and actuates the minutes and hours digit drivers. Furthermore, via line 780 the set hours switch is coupled to control logic 726c for enabling NAND gate 436 to allow the 1 Hertz clock via line 720b to increment the hours counter by an appropriate number of pulses for time setting.

Referring now to the one-out-of-four decoder 724, a plurality of NOR gates 132-139 are responsive to lines 738 from the countdown chain 718 for generating a one-out-of-four select. A duty cycle of approximately 23% or 24% is chosen so that only one of the four outputs from the one-out-of-four decoder is actuated at any one time. Outputs 781 are coupled to NAND gates 143-148 for selectively coupling the contents of the respective seconds, minutes, and hours registers on to the bus lines for communication to the decoder 732, and lines 781 are coupled to the digit drivers for enabling each digit sequentially per cycle.

Referring now to the bus drivers 728, a plurality of open collector NAND gates 512, 514-520, 523-530 and 533-540 are provided for driving the bus lines 729 which couple the counters to the decode matrix 732. Inverters 511, 521, 522, 531, 532 and 541 are responsive to the control logic 726a and specifically to NAND gates 143-148 for selectively coupling the contents of the appropriate register on to the bus line at the appropriate time. That is, during the display minutes/hours cycle, inverters 522, 531, 532 and 541 sequentially effect communication of the four digits of the minutes and hours counter on to the bus lines 729 per cycle. Upon the display seconds mode, inverters 511 and 521 effect serial communication through the bus drivers on to the bus lines of the units and tens digit from the seconds counter.

Coupled to the bus lines for receiving the selectively transmitted information from the respective counter is a BCD seven segment decoder 732. The binary coded decimal information from the respective counters are logically decoded to drive a conventional seven segment display. The display blanks on state 15, or a BCD code of 1111 so that during the period of time when the digit drivers 730 are deactuated, the segment drivers are also deactuated. The output of the decoder 732 is coupled through drivers 732 to the output pins which lead to the display. Drivers 732 are implemented using conventional multi-emitter TTL logic.

Figure 2B:
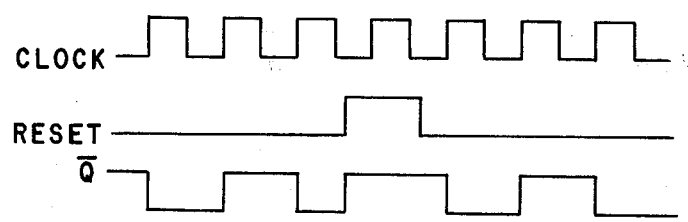
Figure 2C:
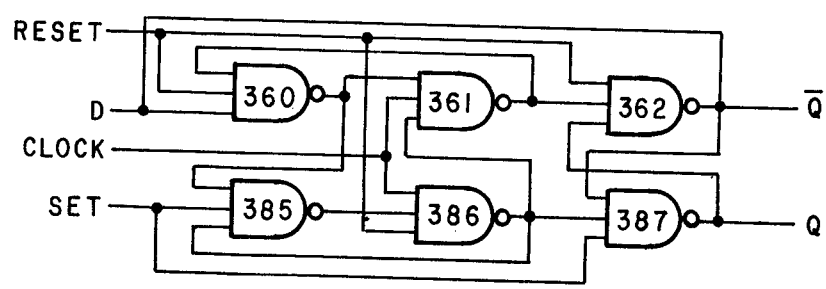
Figure 3B:
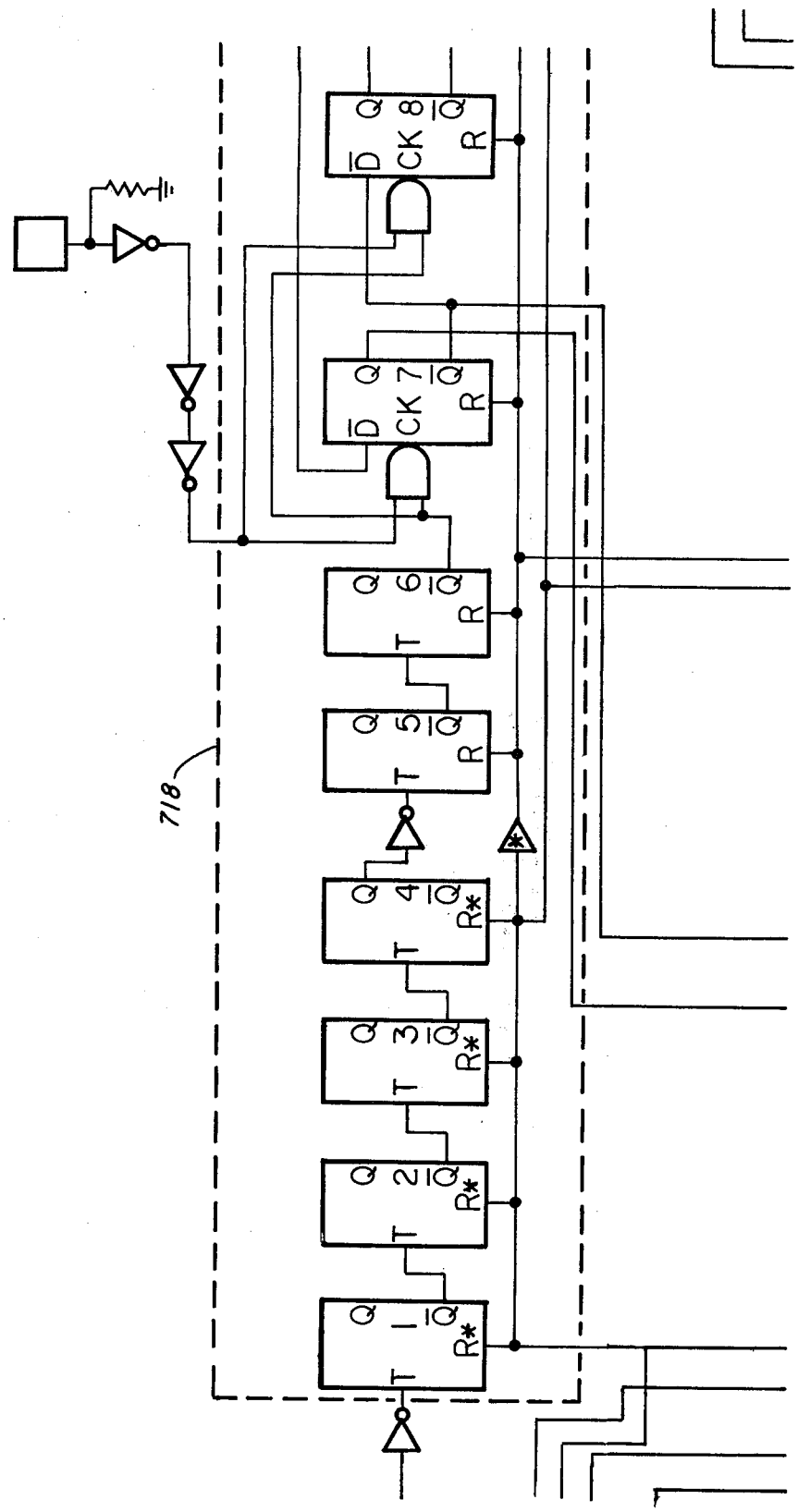
Figure 3C:
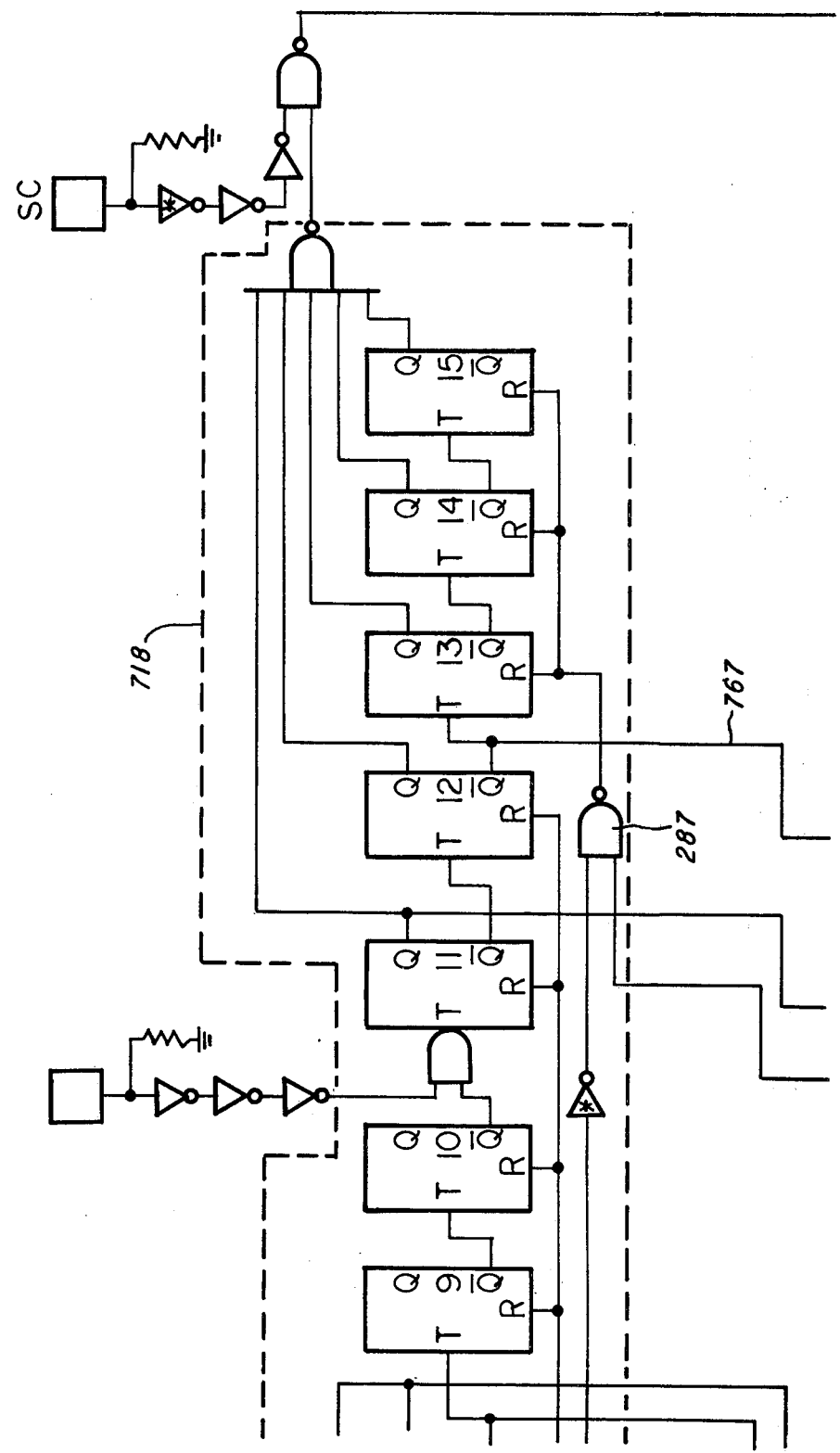
Figure 3D:
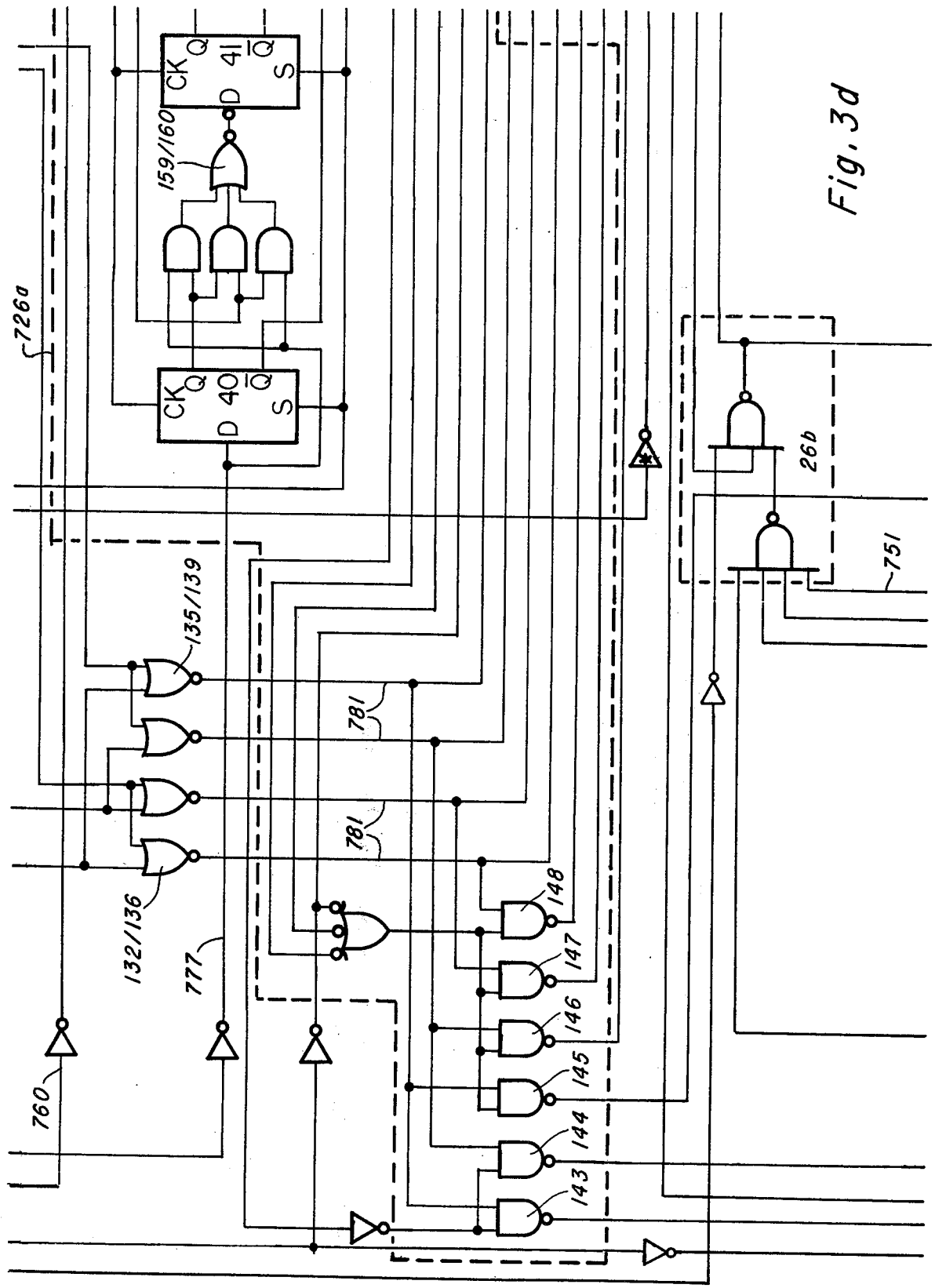
Figure 3E:
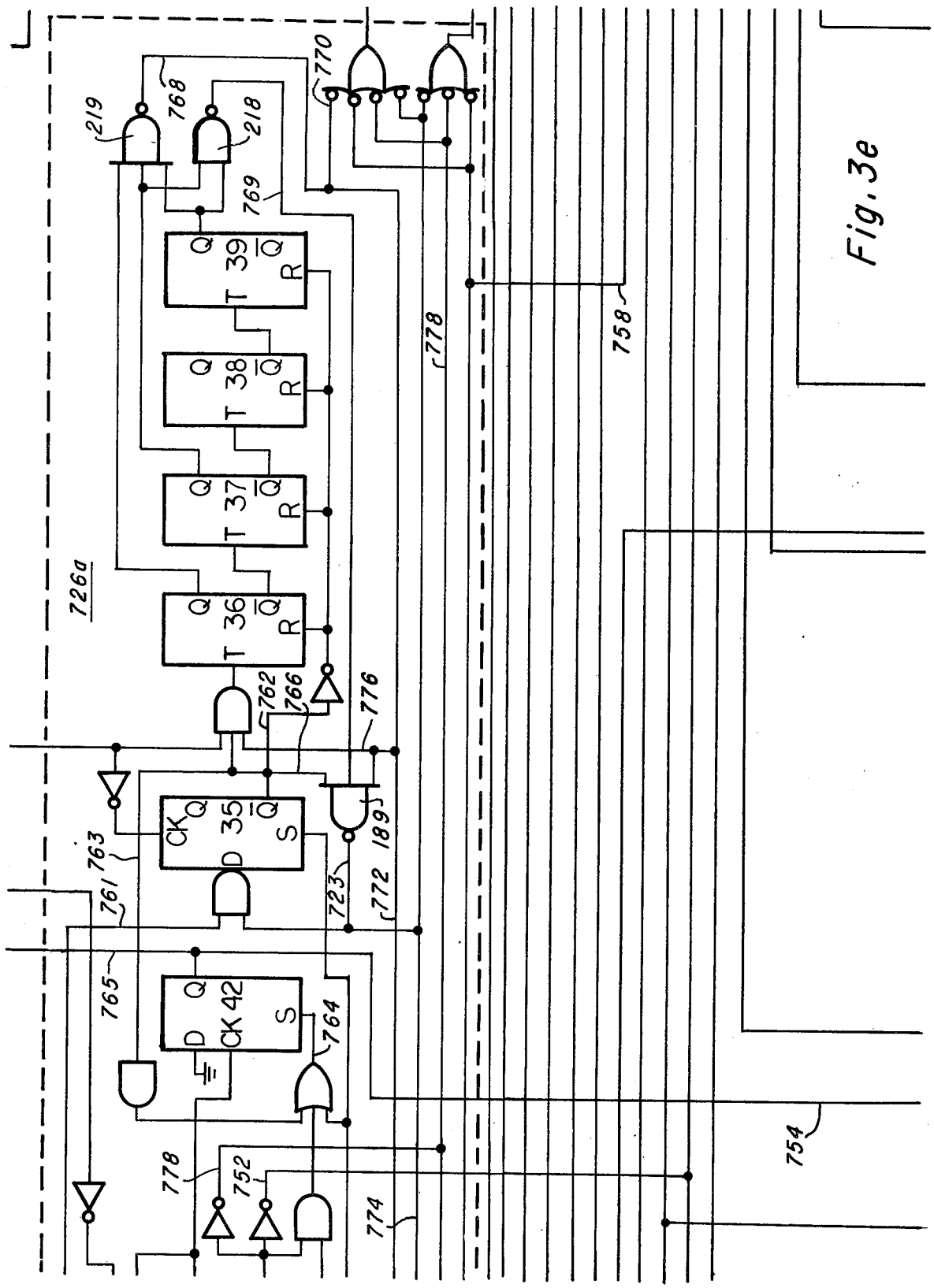
Figure 3F:
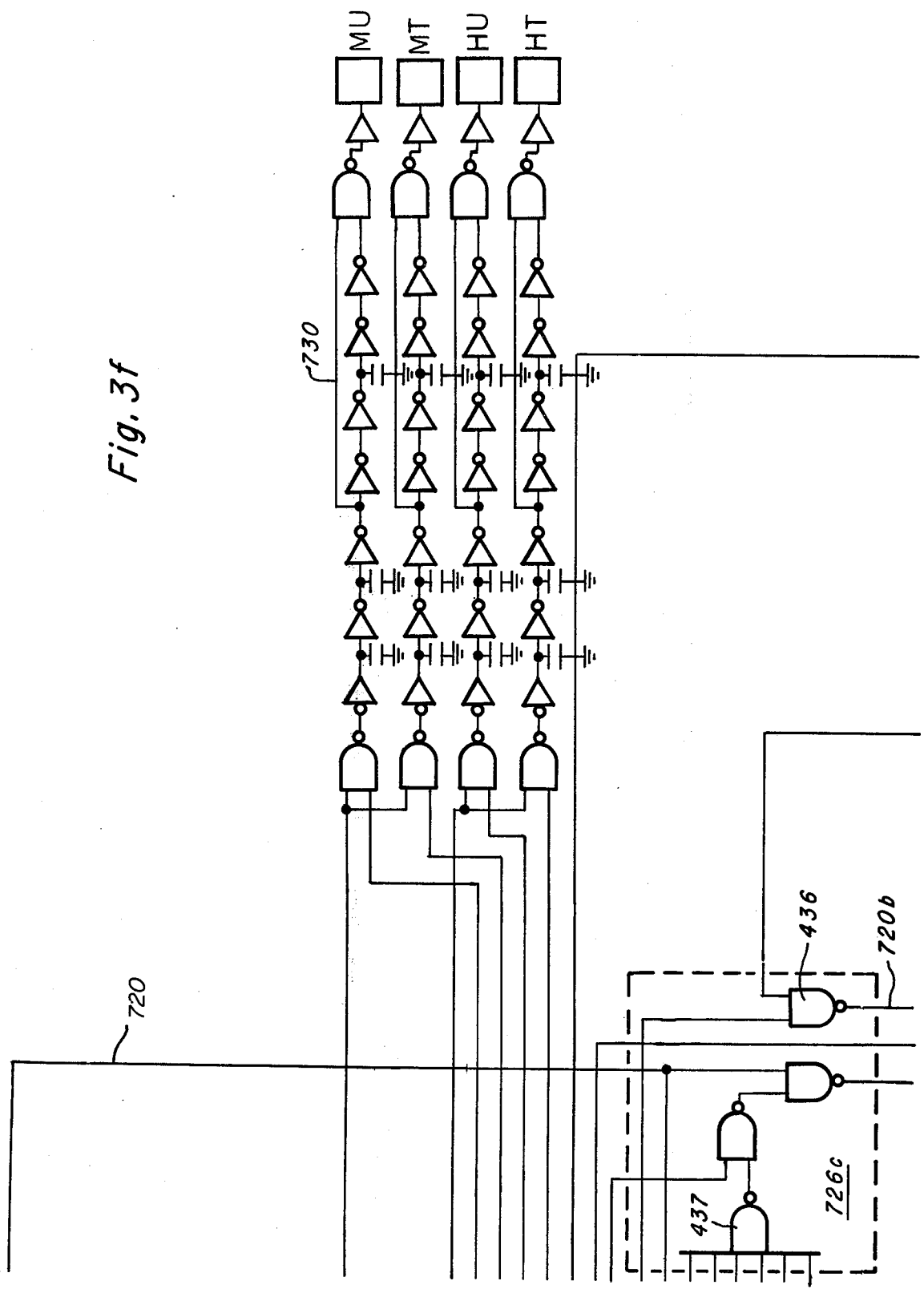
Figure 3G:
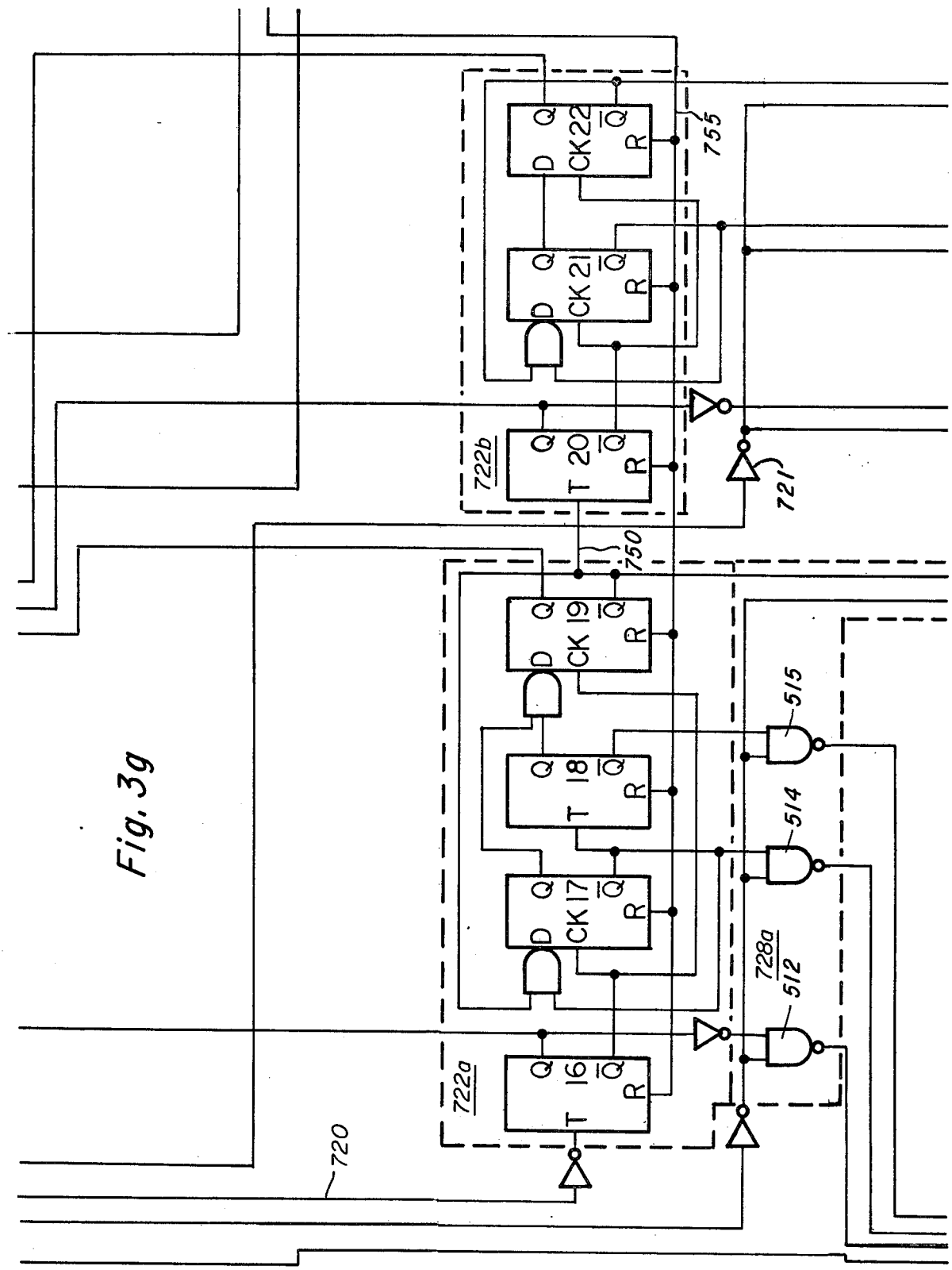
Figure 3H:
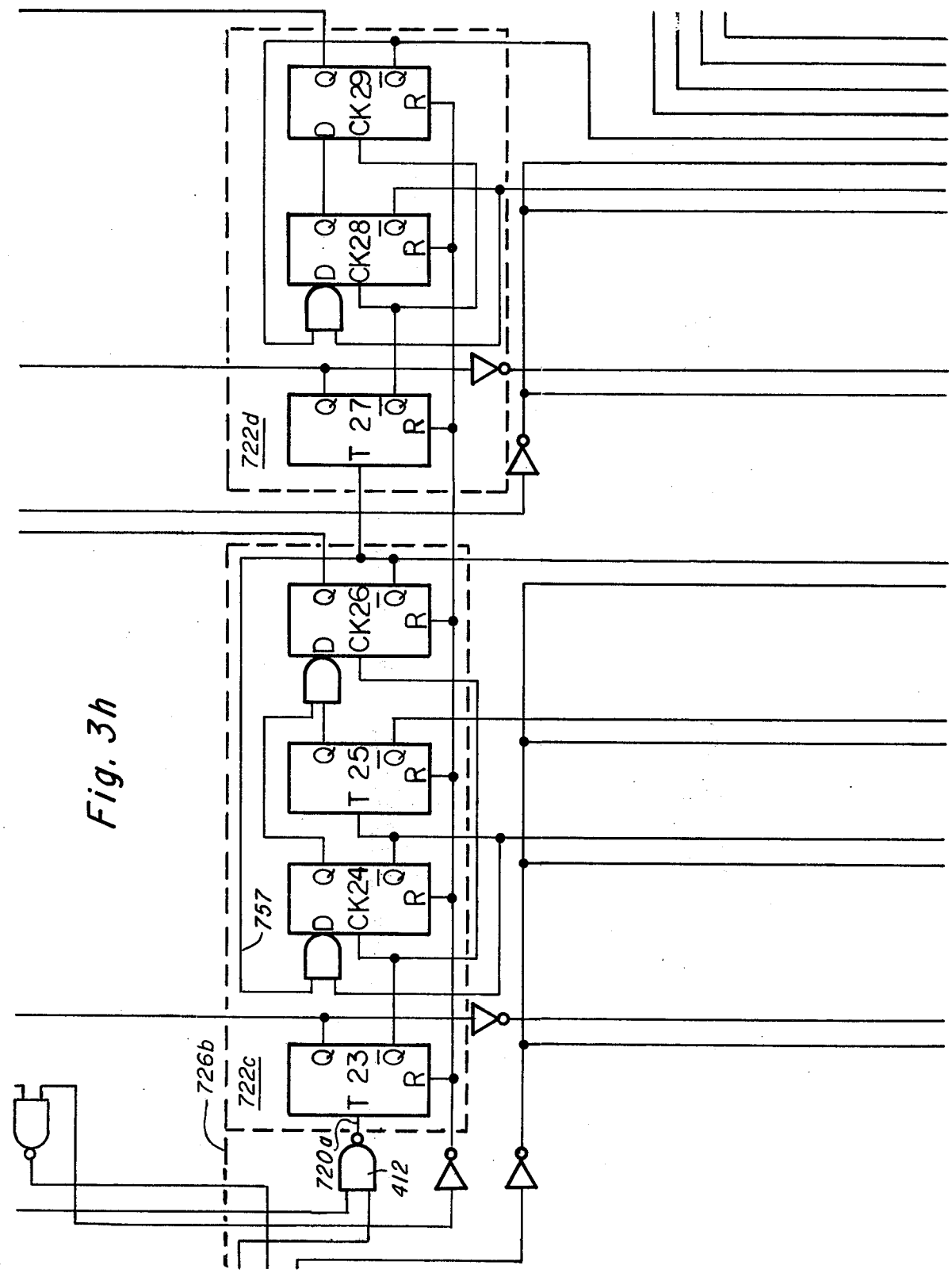
Figure 3I:
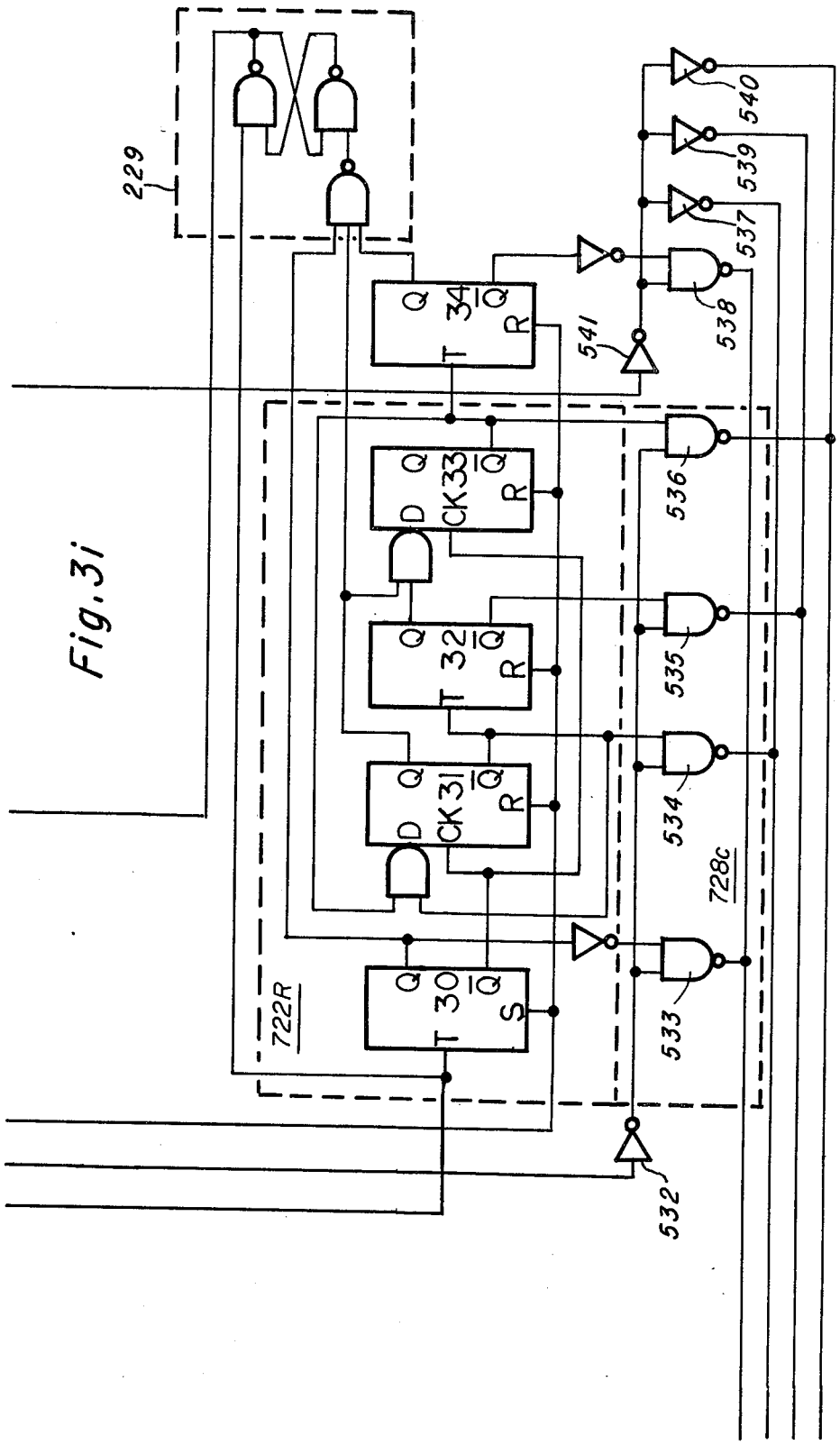
Figure 3J:
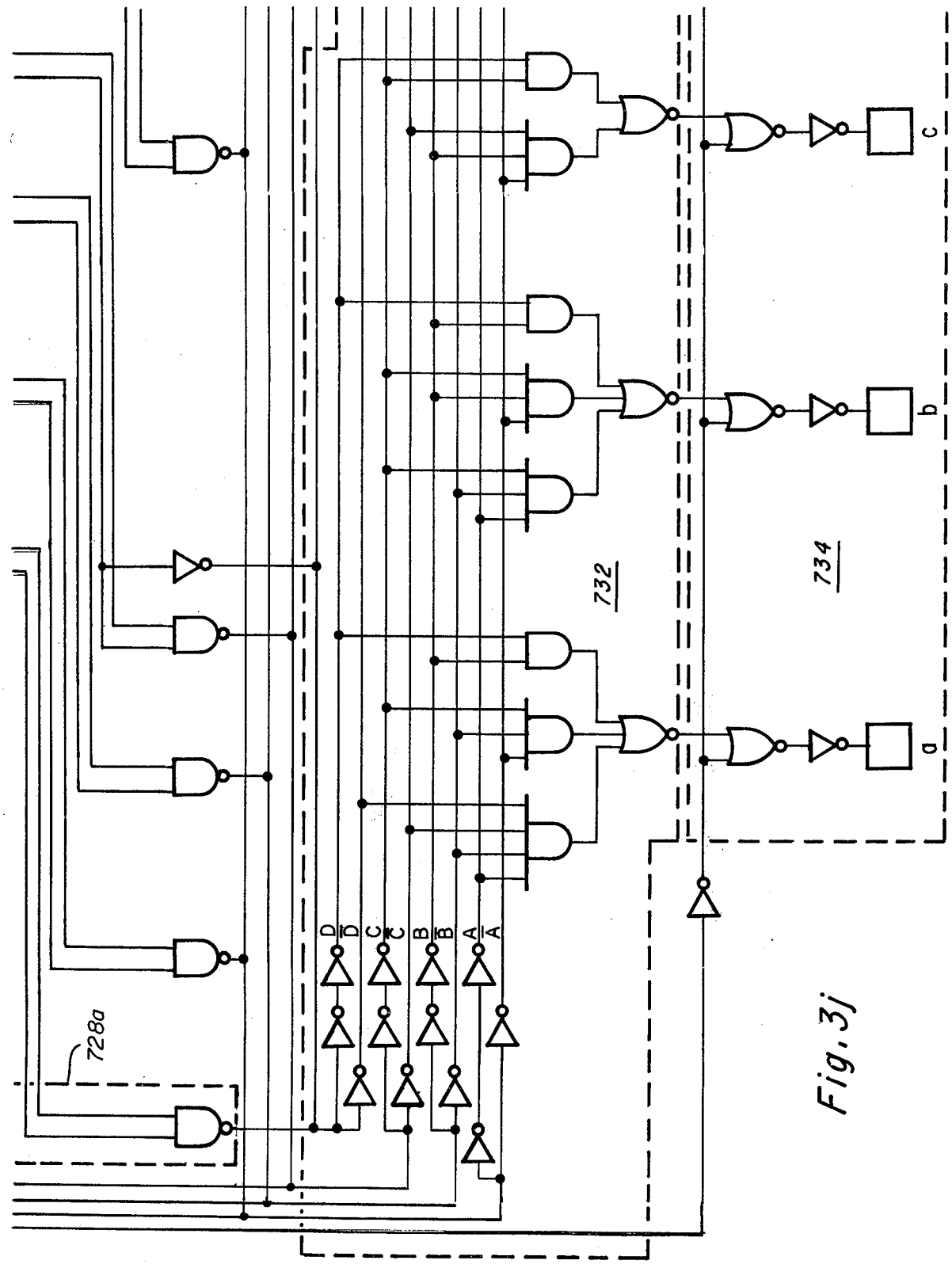
Figure 4A:
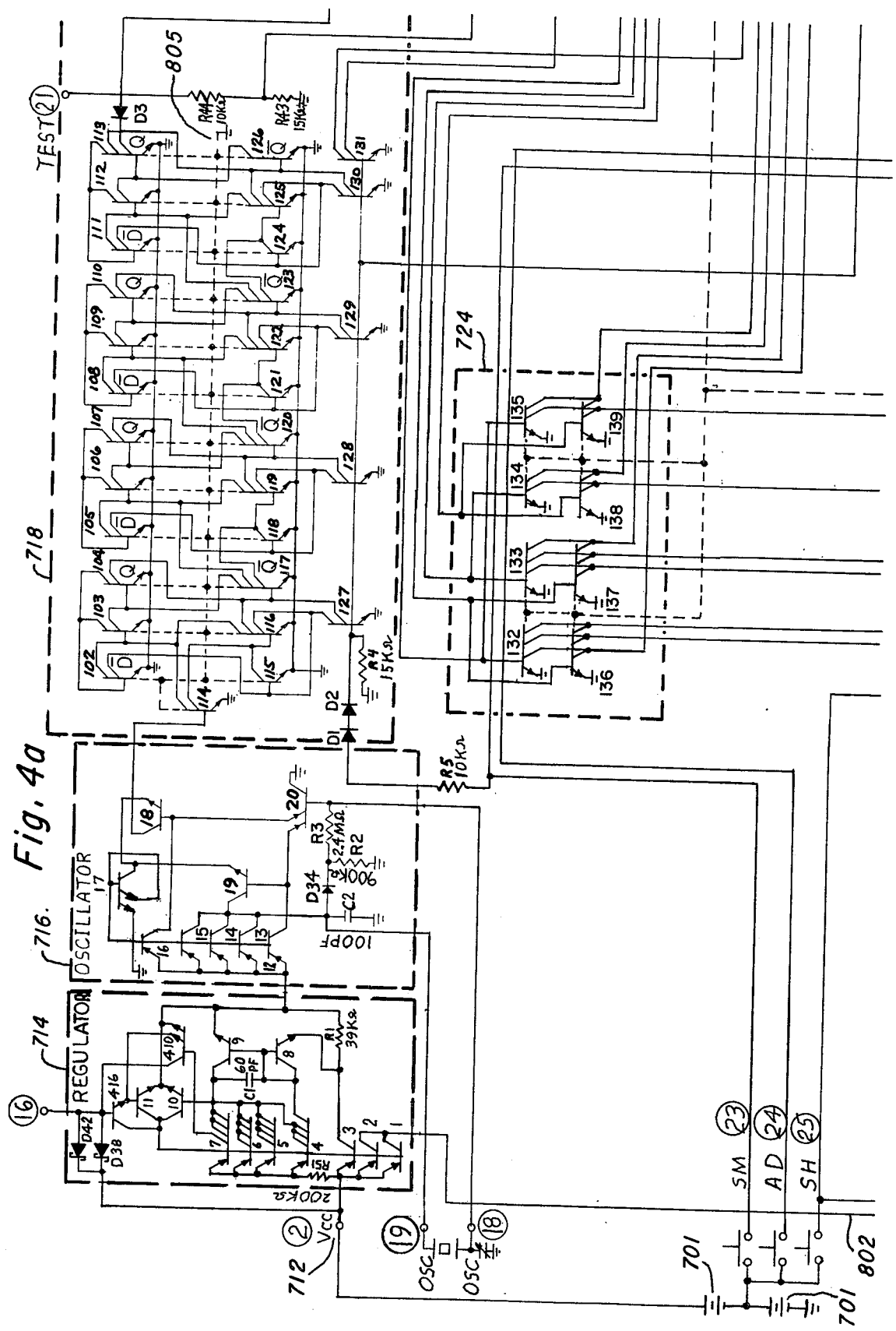
Figure 4B:
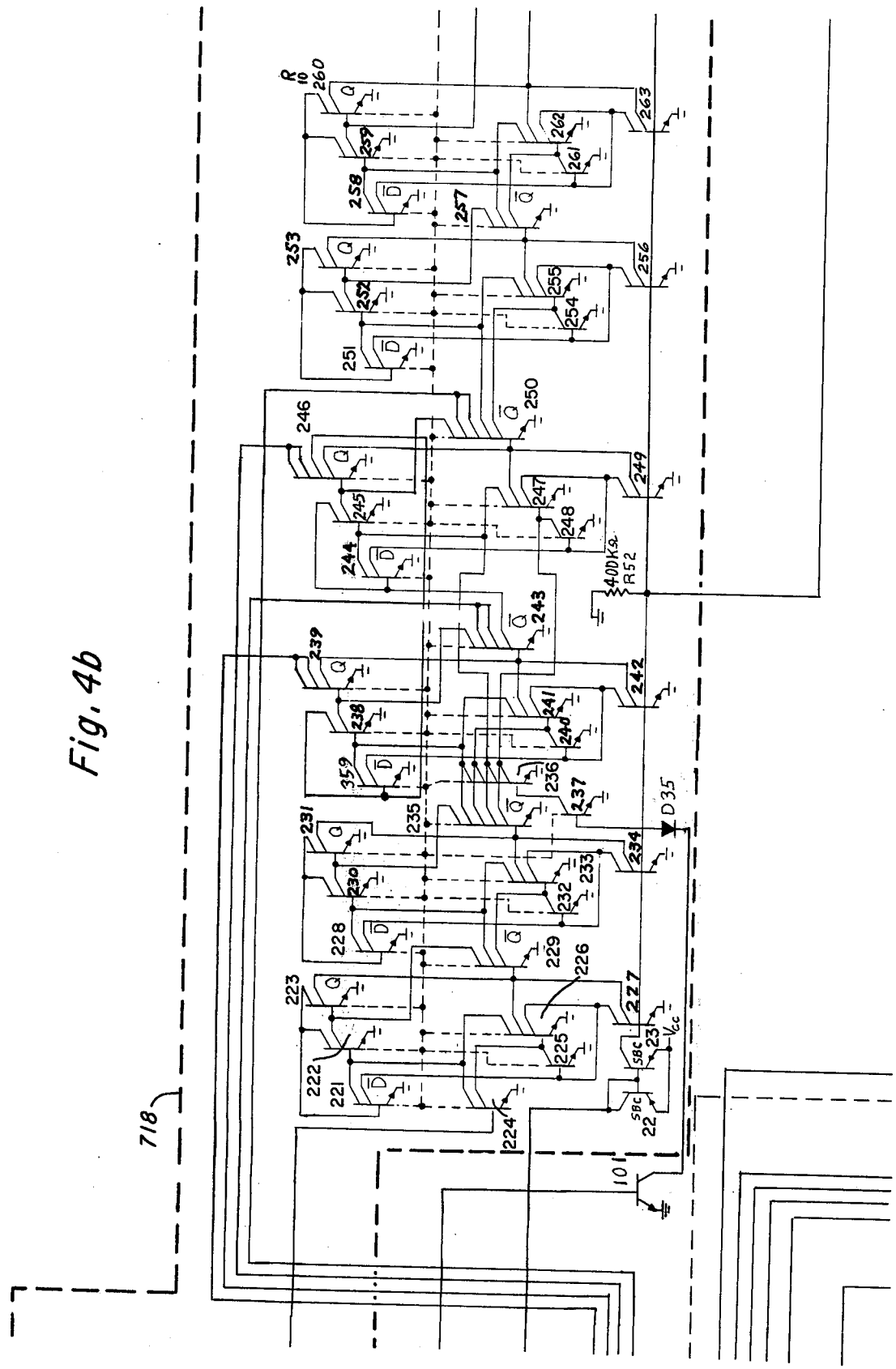
Figure 4C:
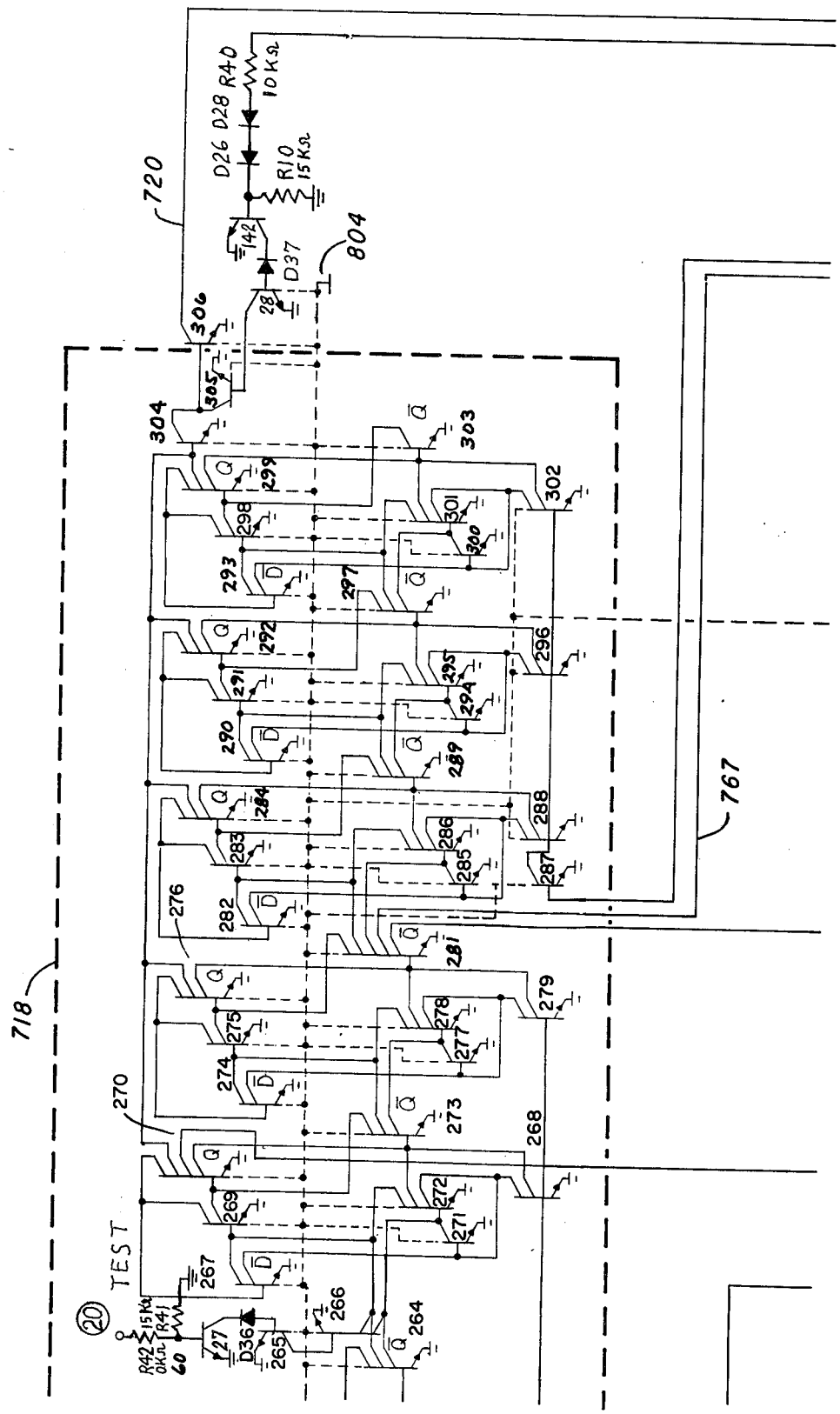
Figure 4D:
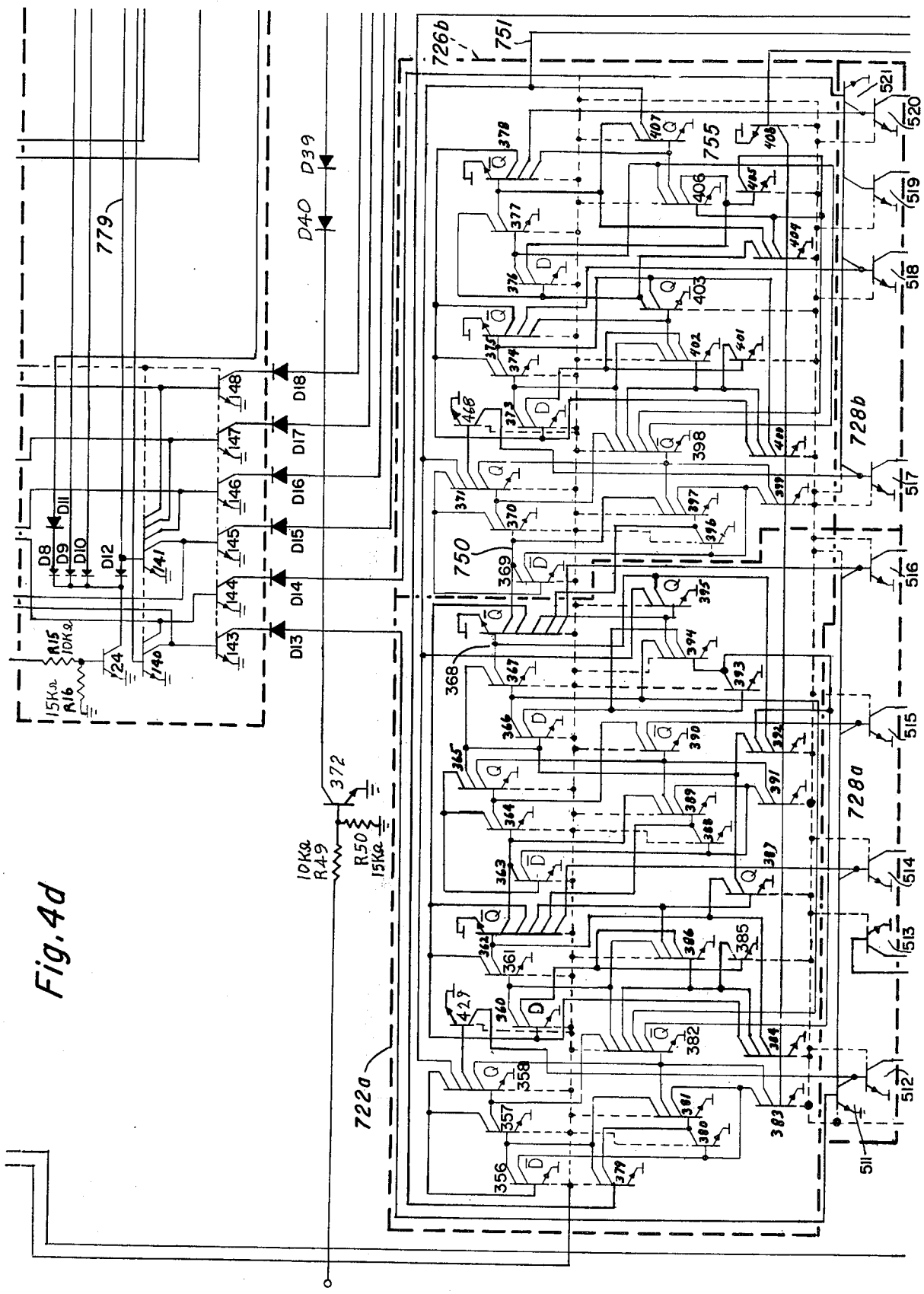
Figure 4E:
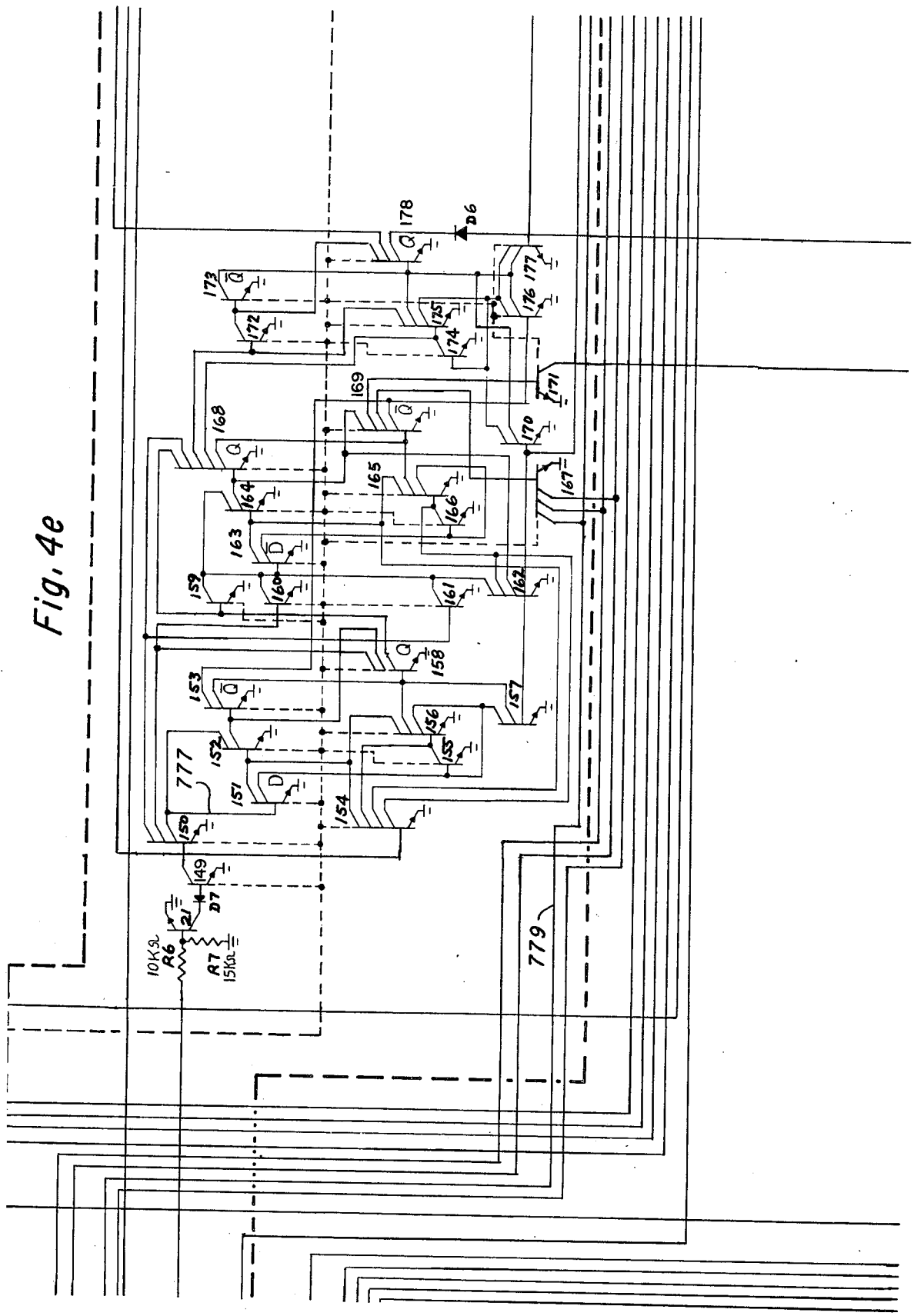
Figure 4G:
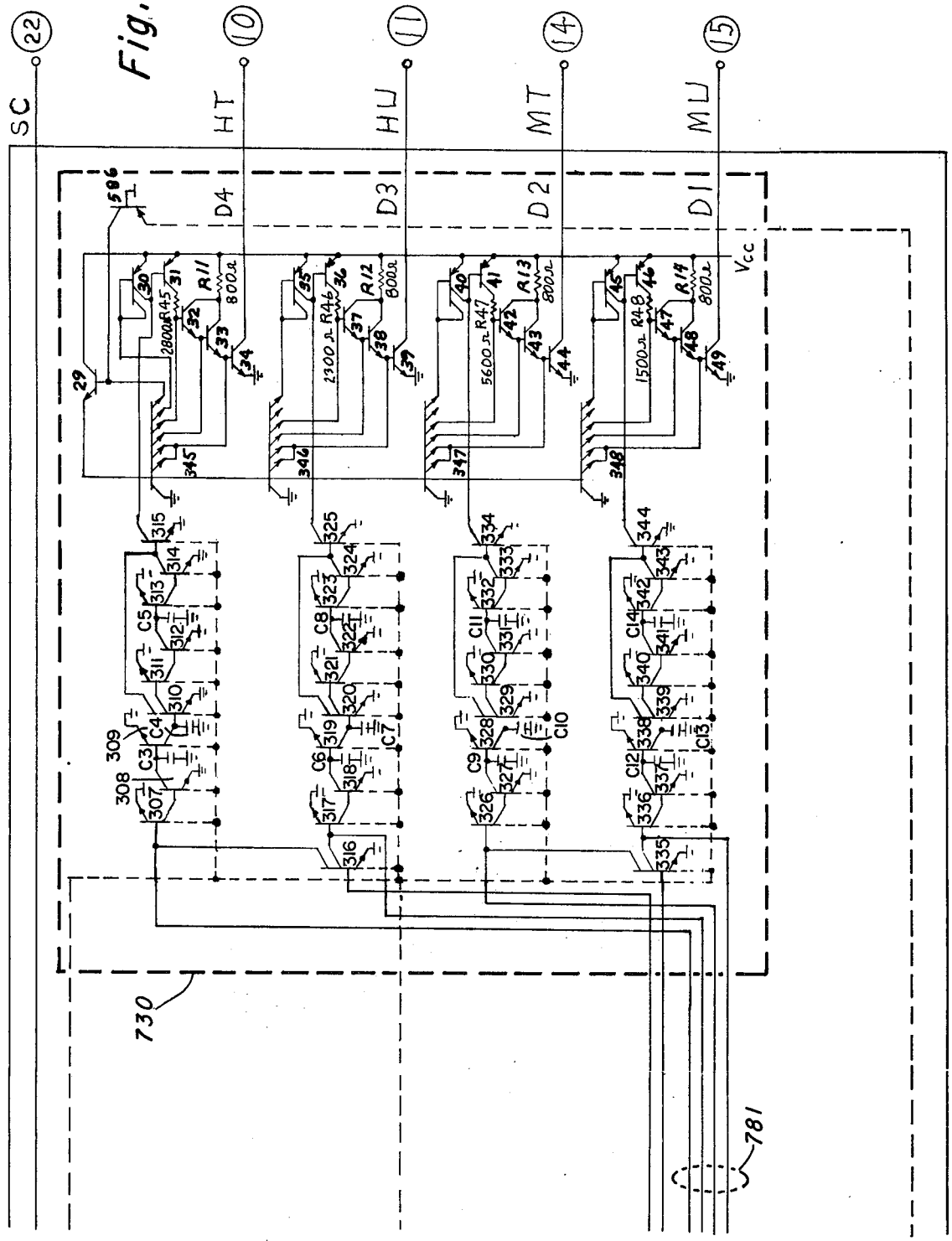
Figure 4H:
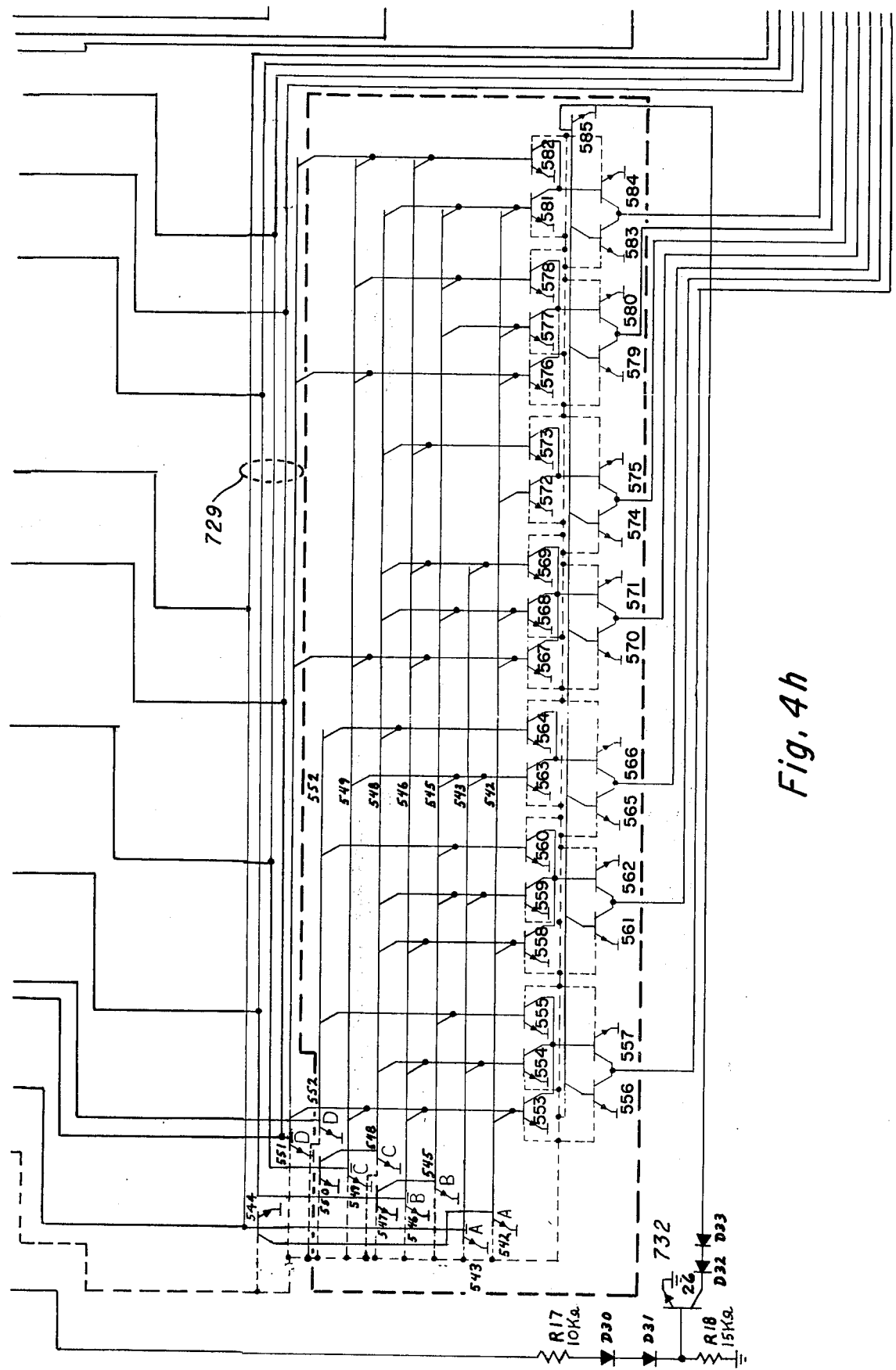
Figure 4I:
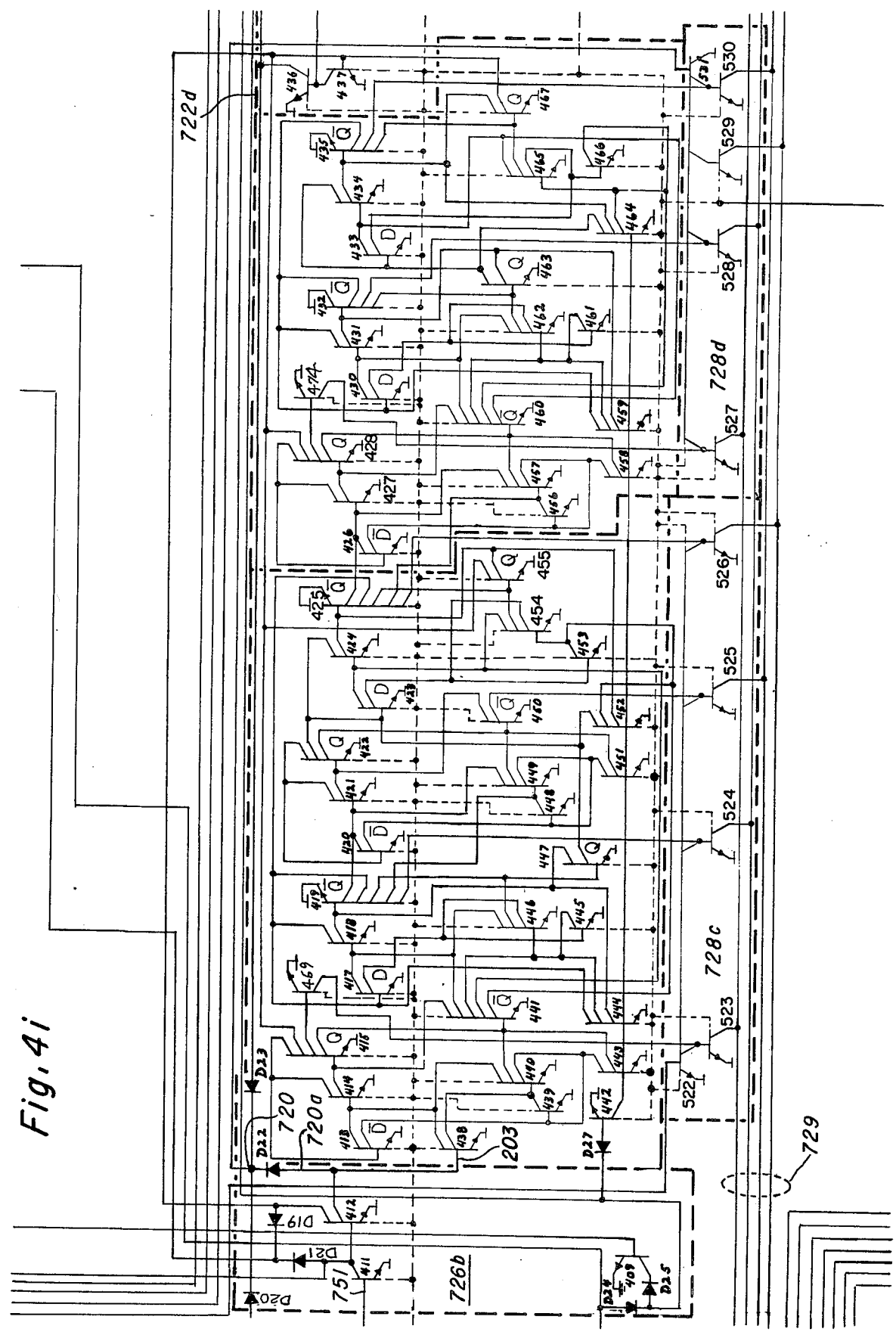
Figure 4J:
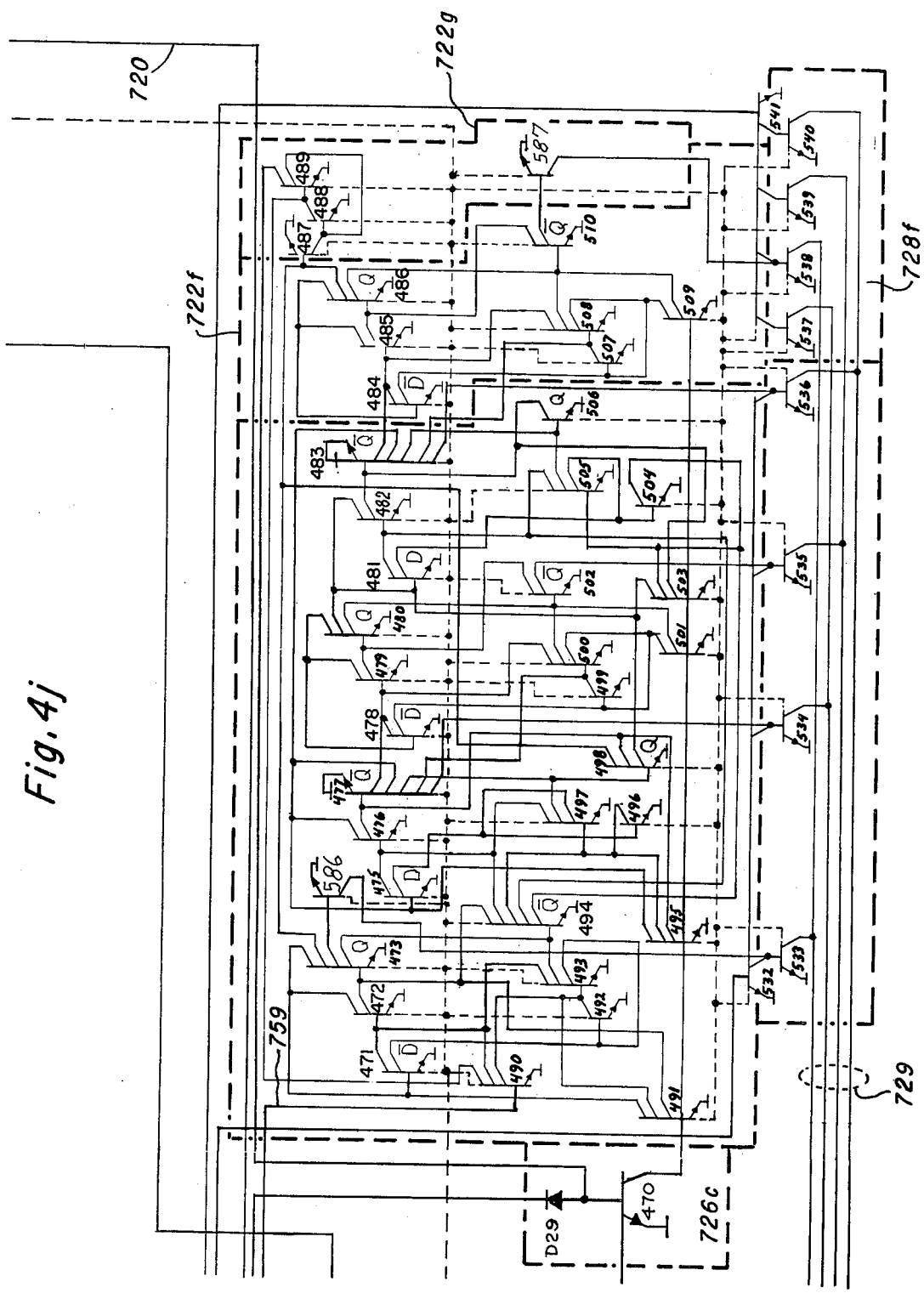

Referring now to FIGS. 2a-2c, there are depicted the D type toggle flip-flop implemented in I²L technology, a representative set of wave forms, and a conventional D flip-flop in logic form. The conventional D flip-flop is implemented having its $\overline{Q}$ output fed back to the D input, with a set terminal provided for setting the Q output high upon command. In integrated injection logic as is well known, a multi-collector I²L transistor may be utilized to provide a logic NAND gate, with I²L technology capable of accepting wired AND connections. Referring to FIG. 4, the D flip-flop comprising transistors 360-362, 382 and 384-387 implement an I²L D toggle flip-flop. The logic representation therefor is represented in FIG. 2c with the respective I²L transistor labeled which provided the appropriate NAND gate. It is noted that the input to gate 361 in FIG. 4 is a single wired AND function from the clock input, from the output of gate 386, and from the output gate 360.

FIG. 2c depicts a D toggle flip-flop implemented in I²L technology whereby the outputs and D inputs are inverted such that the Q output is fed back to a D input. Such a modification is advantageous in that the set and reset terminals also become inverted. As seen from FIG. 2c, three reset inputs to gates 360, 386 and 362 are required while only two set inputs to gates 385 and 387 are required. Therefore, when utilizing D flip-flops in a toggle mode as described in this watch system which require reset pulses, then only a two collector reset transistor such as transistors 127–130 is required. Referring to the counters in general and specifically counter 722a, it is seen that both types of D flip-flops are utilized, one having the $\overline{Q}$ output fed back to the D input requiring a three collector reset transistor, and a D flip-flop having the Q output fed back to a $\overline{D}$ input and having a two collector reset transistor. By eliminating the requirement for an additional collector on the reset transistor and the resulting metal interconnect, a more dense and less power consuming circuit is provided.

Circuit operation of the D flip-flop having outputs and D inputs and set and reset control functions inverted in as follows: Assuming initially upon power up that transistor T6 is conductive, base drive is removed from transistor T2 and transistor T3 through the associated wired AND gates. Assuming that the clock is low, then the base drive for transistors T4 and T5 is removed through their associated wired AND gate. Base drive for transistor T1 is provided by its associated wired AND gate as T2 is biased nonconductive. As transistors T1–T6 are implemented in integrated injection logic, as above discussed with respect to this specific watch circuitry, a transistor is inherently in the conductive mode unless the base drive has been removed therefrom by means of another device, such as a collector emitter path. The flip-flop in the state above described resides in a stable condition. Then, when the clock goes to a high logic state initially, base drive is provided for T5 as T2 is biased nonconductive. T5 conducts and removes base drive from transistor T6, and accordingly base drive is provided for transistor T3. When the clock subsequently goes low, base drive is removed from transistor T5, which in combination with the nonconductive state of transistor T6 provides base drive for transistor T2. The conduction of T2 removes base drive from T1 and T5. When the clock goes high for a second time, base drive is provided for transistor T4 which removes base drive from transistor T3. With transistor T2 and T5 being biased nonconductive, base drive is provided for transistor T6 which removes base drive from T2. When the clock goes low again, base drive is removed from T5 and with T4 and T2 biased nonconductive, base drive is provided for T1. This cycle continues as long as the clock is present unless a reset pulse occurs. A reset pulse results in the $\overline{Q}$ output being set to a high state. When the reset line goes high, base drive is provided for transistor T7 causing it to remove base drive from transistors T3 and T1. With transistor T3 beingn biased nonconductive, the $\overline{Q}$ output is rendered high.

It will be appreciated that a bipolar electronic watch has been provided implemented in bipolar integrated injection logic. As the requisite system speed, power consumption is minimal, and as little as 6 microamps is required to drive the timing circuitry. Further, power savings is effected by grading the power supplied to the countdown chain in that the geometries of the emitter of the injector transistor are varied such that flip-flops operating at a higher frequency receive more injection current. Still further, power savings is effected by coupling the oscillator which provides the system clock in series with the regulator such that current utilized by the regulator in generating its regulated output is reconsumed by the oscillator. Therefore, overall system power consumption is reduced. The electronic circuitry of the system is partitioned into a plurality of electronic levels which are series interconnected by a diode. Accordingly, each logic level uses the same amount of current and further reduces system power consumption. The diode connecting the logic levels reduces the voltage swing of the transistor interfacing the interconnected logic level and therefore reduces switching time and improves circuit performance. Application of a D toggle flip-flop having its outputs inverted and its D input inverted allows an I²L implementation which eliminates one transistor or one collector of a multi-collector transistor over a conventional D toggle flip-flop configuration. To reduce logic circuitry otherwise required, asynchronous counters are used for the seconds, minutes and hours counters, and the output of each respective counter is used as a gating input for gating the 1 Hertz signal clock into the next counter.

While various embodiments have been described in detail herein of an I²L electronic wristwatch, various changes will be apparent to those skilled in the art without departing from the spirit or scope of the invention.

What is claimed is:

1. A pair of serially connected D type flip-flops, each flip-flop having D and clock inputs, and first and second outputs, with the first flip-flop further having a set terminal which sets its first output at a high level upon actuation, the second flip-flop having a reset terminal which sets its first output to a low level upon actuation, said first D flip-flop having its second output coupled into the clock terminal of said second flip-flop, and said set input utilized at a reset input for generating a logic one at said second output of said first flip-flop.

2. The combination according to claim 1 wherein said first flip-flop has its first output terminal connected to said D input and said second flip-flop has its second output terminal connected to its D input in the toggle mode.

3. The combination according to claim 2 wherein said first flip-flop comprises six NAND gates, the first gate having inputs responsive to the D terminal input, and the output of the second NAND gate, the second NAND gate having an input responsive to the output of said first NAND gate, to the clock signal, and to the output of the fifth NAND gate, the third NAND gate having an input responsive to the output of said second NAND gate and to said first output terminal, the fourth NAND gate having an input responsive to said first NAND gate and to the output of said fifth NAND gate, the fifth NAND gate having an input responsive to the output of said fourth NAND gate and to the clock signal, and the sixth NAND gate having an input responsive to the fifth NAND gate and to said second output terminal, said first fliip-flop further having a setting means coupling said set terminal to the input of said fourth NAND gate and to the input of said sixth NAND gate for setting said second output terminal to a logic high level.

4. The combination according to claim 3 wherein each of said NAND gates comprises a vertical NPN transistor and a lateral PNP transistor for selectively injecting base drive into the vertical NPN transistor operating in an inverse mode, and said setting means comprises another PNP lateral PNP transistor injecting base drive into a vertical NPN transistor operating in the inverse mode.

5. An electronic digital watch comprising:
   a. clock generating means for generating a clock signal of at least one hertz frequency;
   b. first asynchronous counting means responsive to said clock signal for generating first output signals encoded to indicate seconds and a second output signal indicative of a period of 60 seconds;
   c. first logic means responsive to said clock signal and to said second output signal for selectively translating at least one pulse of said clock signal; and
   d. second asynchronous counting means responsive to said at least one pulse for generating a third output signal encoded to indicate minutes; wherein
   e. said first and second asynchronous counting means are each comprised of at least one pair of serially coupled flip-flops, a first D type flip-flop having a $\overline{D}$ input, first and second outputs, and a set terminal which sets its first output at a high level upon actuation, and a second D type flip-flop having D and clock inputs, first and second outputs, and a reset terminal which sets its first output to a low level upon actuation, said first D flip-flop having its second output coupled into the clock terminal of said second flip-flop, with said set input for generating a logic 1 at said second output of said first flip-flop upon actuation.

6. The electronic digital watch according to claim 5 wherein said first D type flip-flop includes means coupling the first output thereof to the $\overline{D}$ input and said second flip-flop includes means coupling the second output thereof to the D input.

7. The electronic digital watch according to claim 5 wherein each of said flip-flops is comprised of NAND gates implemented as an injection logic bipolar integrated circuit.

8. The electronic digital watch according to claim 7 wherein said first flip-flop comprises a plurality of NAND gates wherein each of said NAND gates comprises a vertical NPN transistor and a lateral PNP transistor for selectively injecting base drive into the vertical NPN transistor operating in an inverse mode, said setting terminal being coupled to another lateral PNP transistor injecting base drive into a vertical NPN transistor operating in the inverse mode.

9. The electronic digital watch according to claim 5 wherein all of said set and reset terminals are coupled together for common actuation.

10. An electronic digital watch comprising:
    a. clock generating means for generating a clock signal of at least one hertz frequency;
    b. first asynchronous counting means including a ten counter stage responsive to said clock signal coupled to a six counter stage for generating first output signals encoded to indicate seconds, and said second stage generating a second output signal indicative of a period of 60 seconds;
    c. first logic means responsive to said clock signal and to said second output signal for selectively translating at least one pulse of said clock signal; and
    d. second asynchronous counting means including a ten counter stage responsive to said at least one pulse coupled to a six counter stage for generating third output signals encoded to indicate minutes; wherein
    e. each of said ten counter stages is comprised of a $\overline{D}$ input, first and second outputs, and a set terminal which sets its first output at a high level upon actuation, a second D type flip-flop having a D and clock inputs, first and second outputs, and a reset terminal which sets its first output to a low level upon actuation, said first D flip-flop having its second output coupled into the clock terminal of said second flip-flop, a third D type flip-flop having a $\overline{D}$ input, first and second outputs, and a set terminal which sets its first output at a high level upon actuation, said second D flip-flop having its second output coupled into the $\overline{D}$ terminal of said third flip-flop, and a fourth D type flip-flop having D and clock inputs, first and second outputs, and a reset terminal which sets its first output to a low level upon actuation, said second and third D flip-flops having their first outputs being coupled to the D input of said fourth flip-flop, said first D type flip-flop having its second output coupled to the clock input of said fourth flip-flop and the second output of said fourth flip-flop being coupled to the D input of said second D type flip-flop; and wherein
    f. each of said six counters includes a first D type flip-flop having a $\overline{D}$ input, first and second outputs, and a set terminal which sets its first output at a high level upon actuation, a second D type flip-flop having D and clock inputs, first and second outputs, and a reset terminal which sets its first outputs to a low level upon actuation, said first D type flip-flop having its second output coupled into the clock terminal of said second flip-flop, and a third D type flip-flop having D and clock inputs, first and second outputs, and a reset terminal which sets its first output to a low level upon actuation, said second D type flip-flop having its first output coupled into the D input of said flip-flop, said second and third D type flip-flops having their second outputs coupled into the D input of said second D type flip-flop and said first D type flip-flop having its second output coupled into the clock terminal of said third D type flip-flop.

11. The electronic digital watch according to claim 10 wherein all of said set and reset terminals are coupled together for common actuation.

12. The electronic digital watch according to claim 10 wherein said counters are implemented as an integrated circuit and wherein each of said flip-flops is implemented in injection logic bipolar circuitry.

13. The electronic digital watch according to claim 12 wherein each of said set terminals is coupled to a first type of bipolar transistor and wherein each of said reset terminals is coupled to a second type of bipolar transistor and wherein each of said first type of bipolar transistors includes at least one less collector than each of said second type of bipolar transistors.

* * * * *